US011270991B1

(12) United States Patent
Chava et al.

(10) Patent No.: US 11,270,991 B1
(45) Date of Patent: Mar. 8, 2022

(54) INTEGRATED CIRCUITS (ICS) EMPLOYING FRONT SIDE (FS) BACK END-OF-LINE (BEOL) (FS-BEOL) INPUT/OUTPUT (I/O) ROUTING AND BACK SIDE (BS) BEOL (BS-BEOL) POWER ROUTING FOR CURRENT FLOW ORGANIZATION, AND RELATED METHODS

(71) Applicant: QUALCOMM Incorporated, San Diego, CA (US)

(72) Inventors: Bharani Chava, Cork (IE); Stanley Seungchul Song, San Diego, CA (US); Mohammed Yousuff Shariff, Hyderabad (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/010,001

(22) Filed: Sep. 2, 2020

(51) Int. Cl.
    *H01L 27/06*     (2006.01)
    *H01L 25/00*     (2006.01)
    (Continued)

(52) U.S. Cl.
    CPC .......... *H01L 25/50* (2013.01); *H01L 21/4853* (2013.01); *H01L 23/49816* (2013.01);
    (Continued)

(58) Field of Classification Search
    CPC ............................ H01L 25/50; H01L 21/4853
    See application file for complete search history.

(56) References Cited

U.S. PATENT DOCUMENTS 10,910,364 B2 *   2/2021   Or-Bach ............... G03F 9/7084
2002/0020862 A1   2/2002   Livengood et al.
(Continued)

FOREIGN PATENT DOCUMENTS

EP          3324436 A1     5/2018
WO    2017052562 A1     3/2017

OTHER PUBLICATIONS

International Search Report and Written Opinion—PCT/US2021/041076—ISA/EPO—dated Oct. 18, 2021.

*Primary Examiner* — Thao P Le
(74) *Attorney, Agent, or Firm* — Qualcomm Incorporated

(57) ABSTRACT

Integrated circuits (ICs) employing front side (FS) back end-of-line (BEOL) (FS-BEOL) input/output (I/O) routing and back side (BS)) BEOL (BS-BEOL) power routing for current flow organization, and related IC packages and methods of fabricating are disclosed. The IC includes a FS-BEOL metallization structure disposed on a first side of a semiconductor layer and a BS-BEOL metallization structure disposed on a second side of the semiconductor layer. The FS-BEOL metallization structure is configured to route I/O signals to the semiconductor devices. The FS-BEOL metallization structure of the IC is also configured to receive power signals to be routed to the semiconductor devices. However, to avoid the need to route the power signals to semiconductor devices through the FS-BEOL metallization structure, thus increasing routing density and complexity the FS-BEOL metallization structure, the power signals are routed from the FS-BEOL metallization structure to the BS-BEOL metallization structure and to semiconductor devices for power.

25 Claims, 13 Drawing Sheets

(51) Int. Cl.
*H01L 23/498* (2006.01)
*H01L 25/065* (2006.01)
*H01L 21/48* (2006.01)

(52) U.S. Cl.
CPC .. *H01L 23/49822* (2013.01); *H01L 23/49827* (2013.01); *H01L 25/0657* (2013.01); *H01L 2225/06513* (2013.01)

(56) References Cited

U.S. PATENT DOCUMENTS

| | | | |
|---|---|---|---|
| 2012/0320550 A1* | 12/2012 | Bar | H01L 23/147 |
| | | | 361/760 |
| 2014/0197522 A1 | 7/2014 | Gu et al. | |
| 2014/0217610 A1* | 8/2014 | Jeng | H01L 23/49827 |
| | | | 257/774 |
| 2014/0374875 A1* | 12/2014 | Yen | H01L 21/283 |
| | | | 257/531 |
| 2015/0137307 A1 | 5/2015 | Stuber | |
| 2015/0279888 A1* | 10/2015 | Chen | H01L 24/83 |
| | | | 257/459 |
| 2017/0213821 A1* | 7/2017 | Or-Bach | H01L 21/76254 |
| 2020/0286871 A1* | 9/2020 | Lift | H01L 24/73 |
| 2020/0381396 A1* | 12/2020 | Chen | H01L 23/3135 |
| 2021/0066184 A1* | 3/2021 | Aleksov | H01L 28/40 |
| 2021/0193571 A1* | 6/2021 | Elsherbini | H01L 27/0248 |
| 2021/0193596 A1* | 6/2021 | Elsherbini | H01L 27/0248 |

* cited by examiner

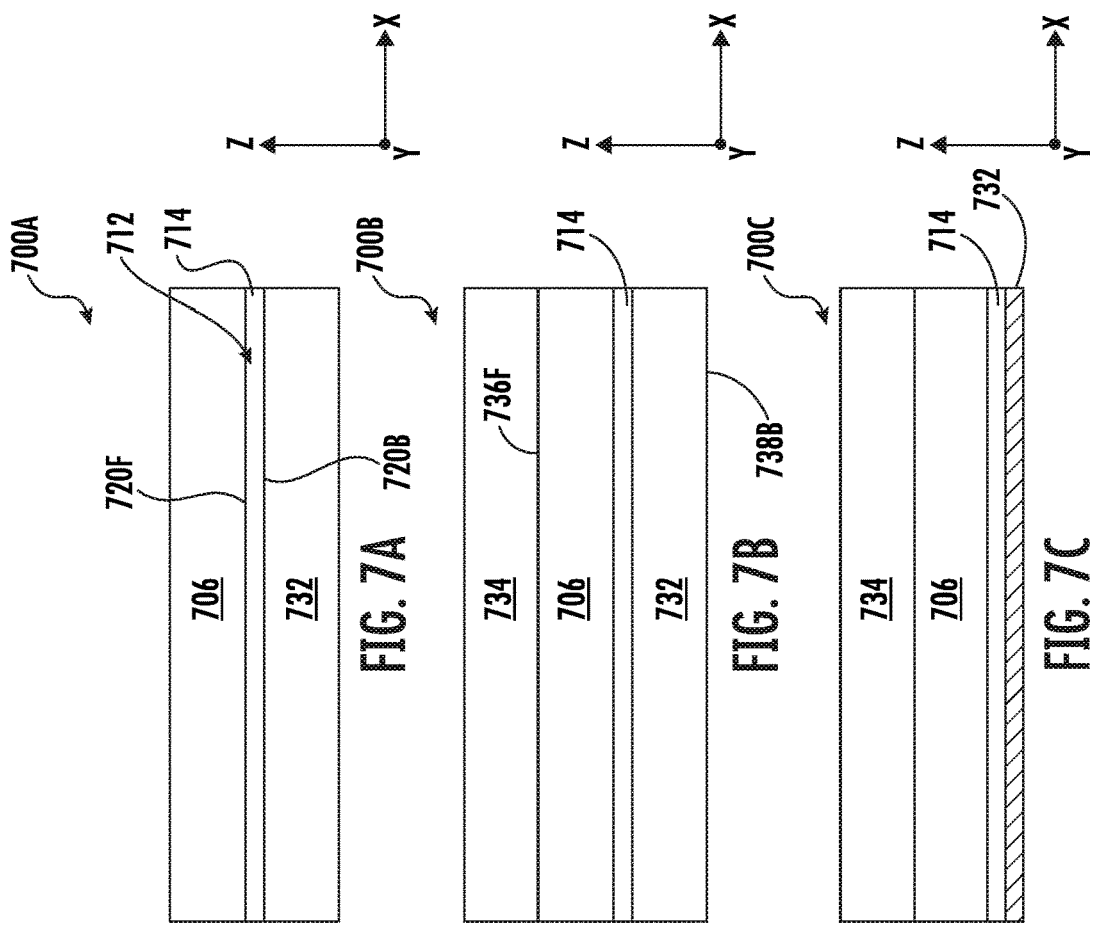
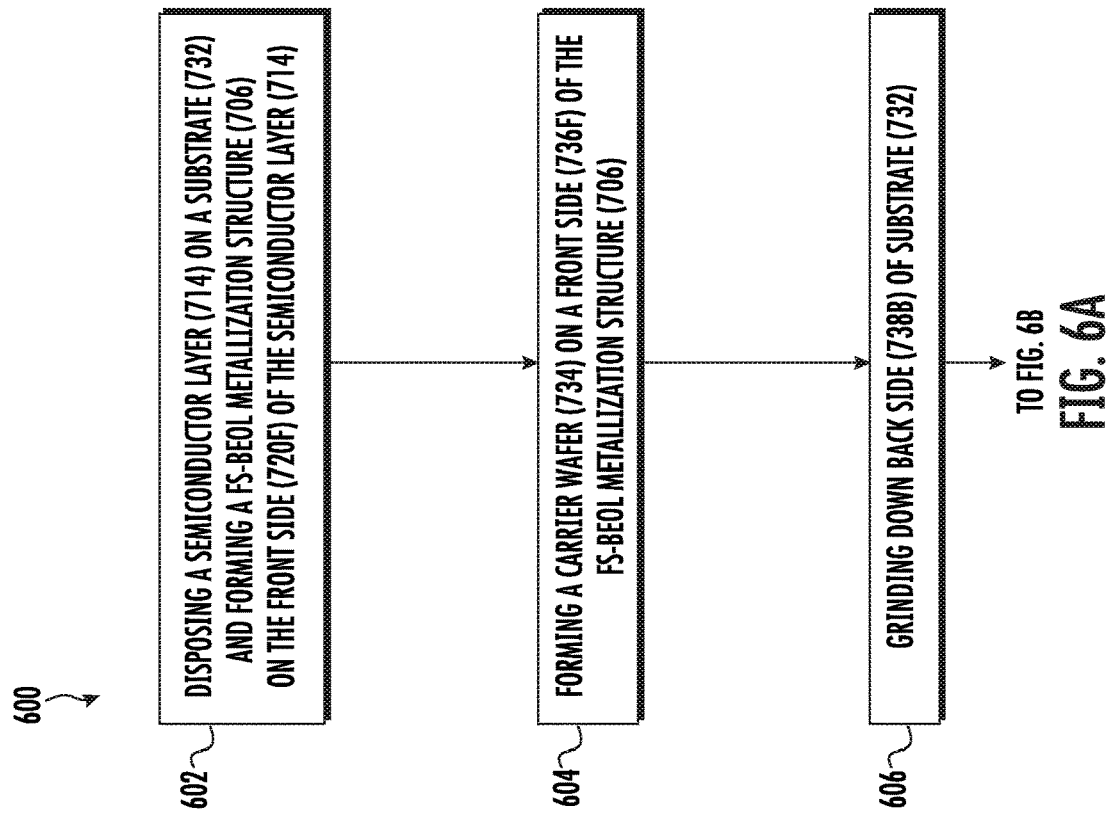

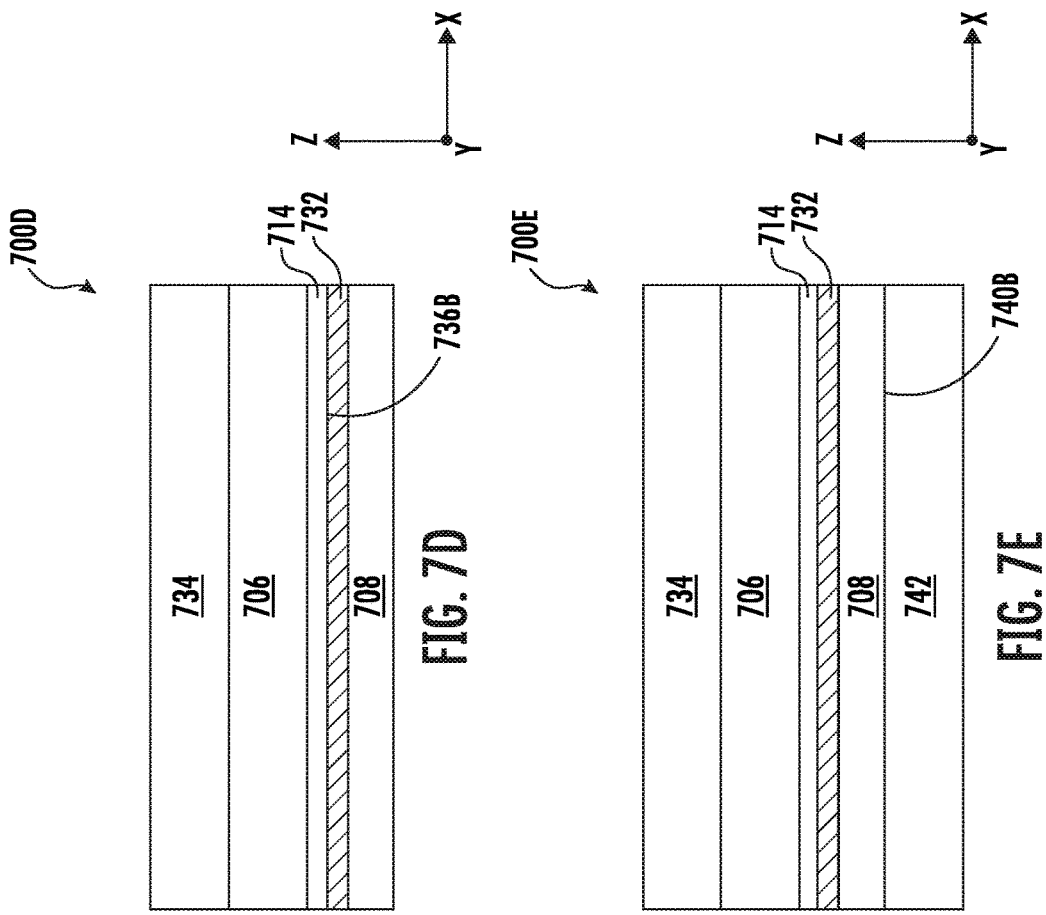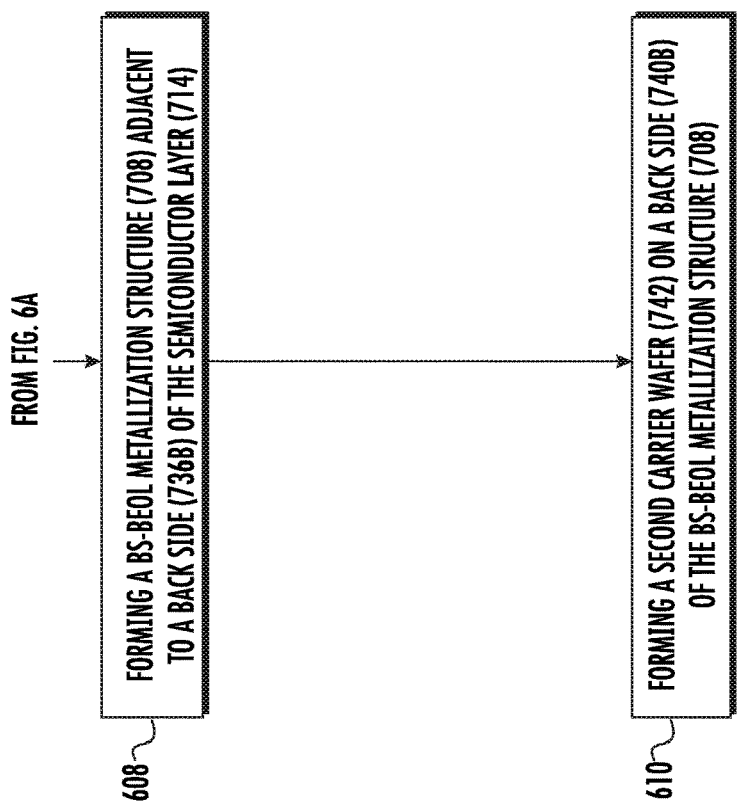

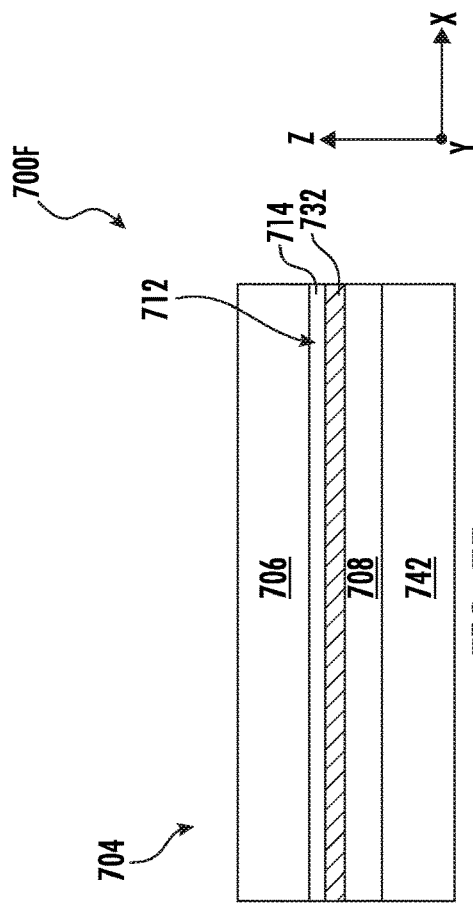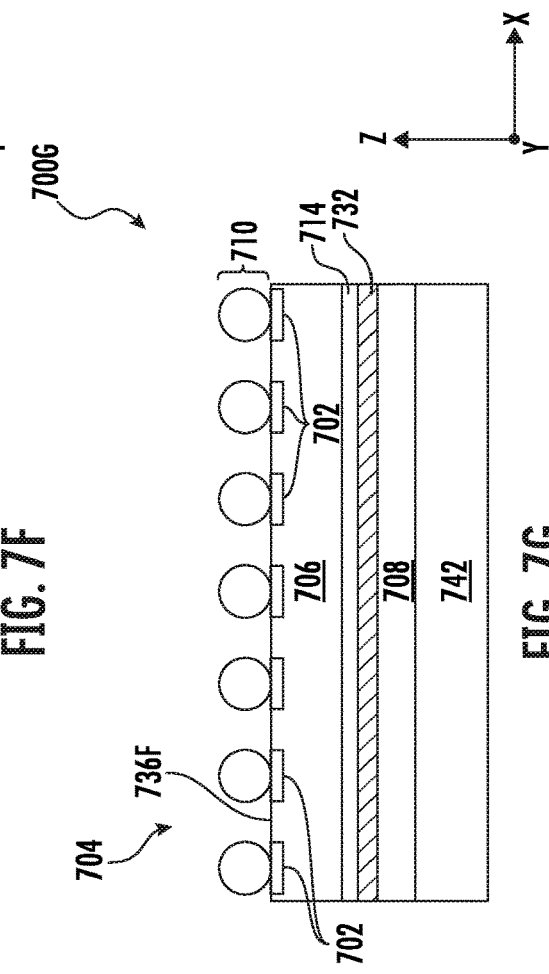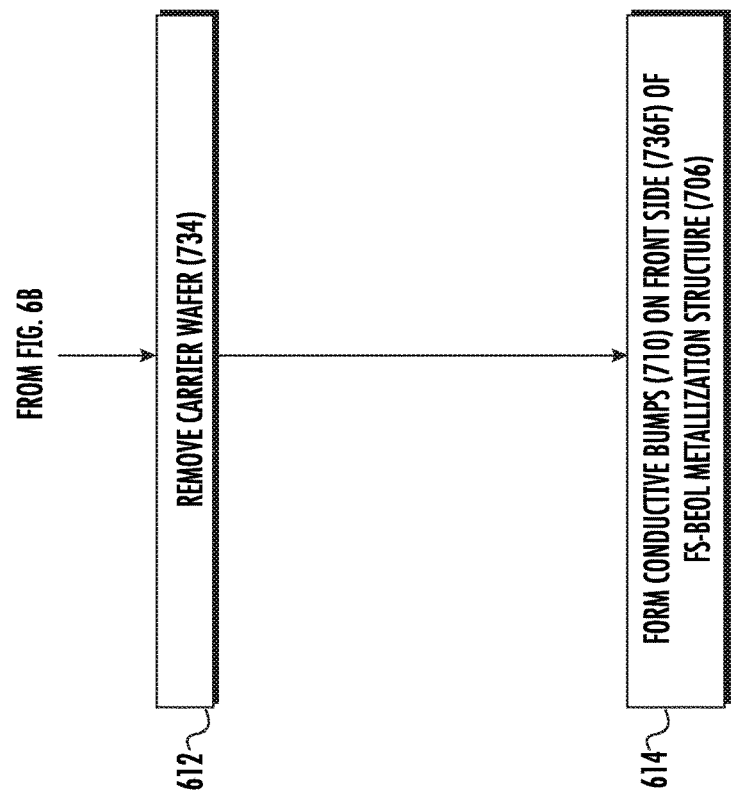

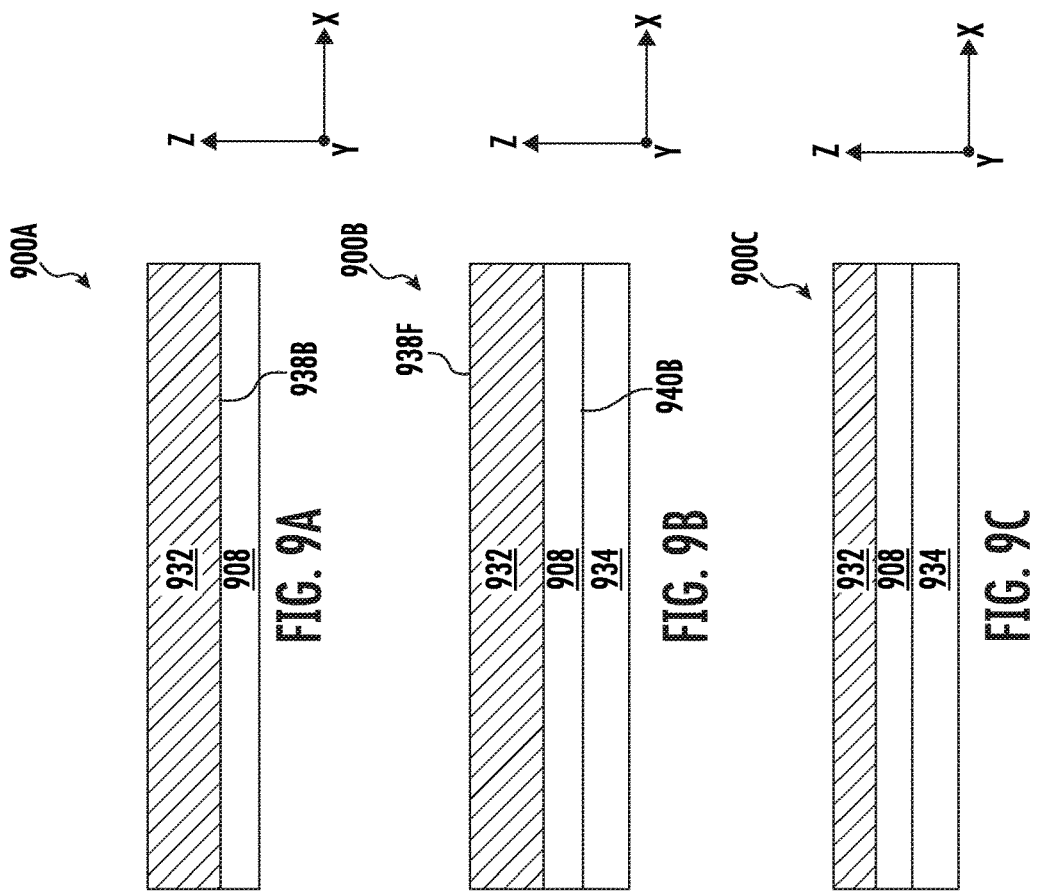
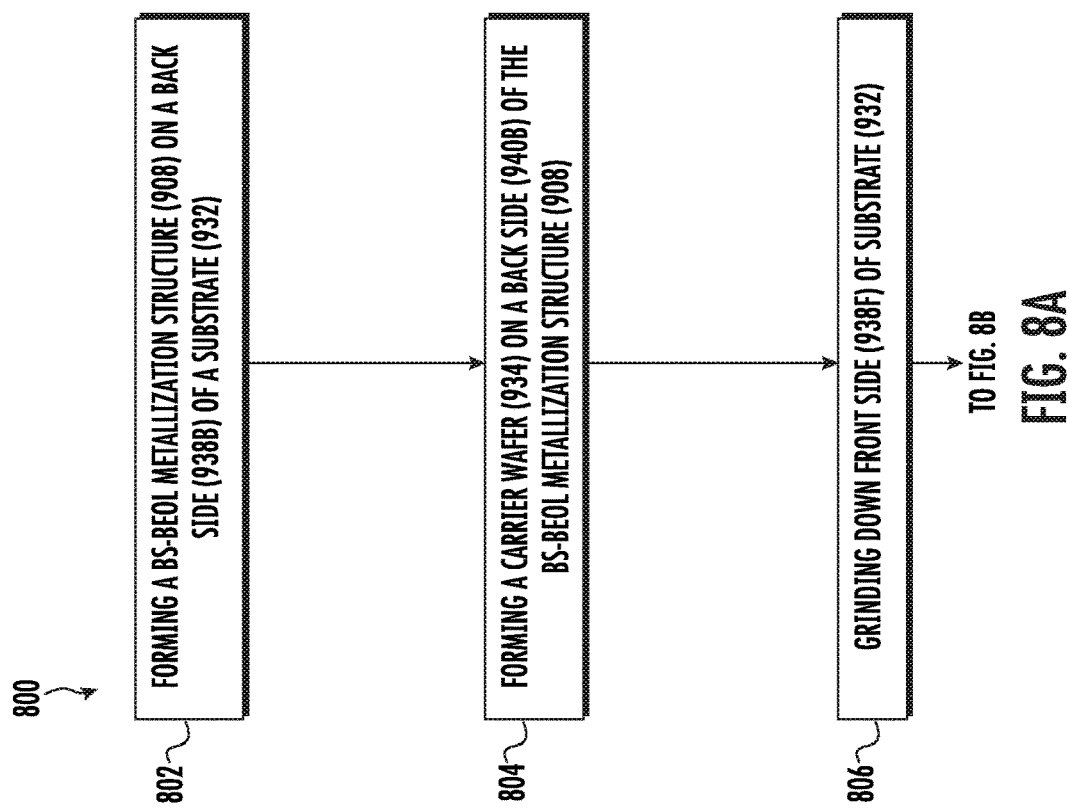

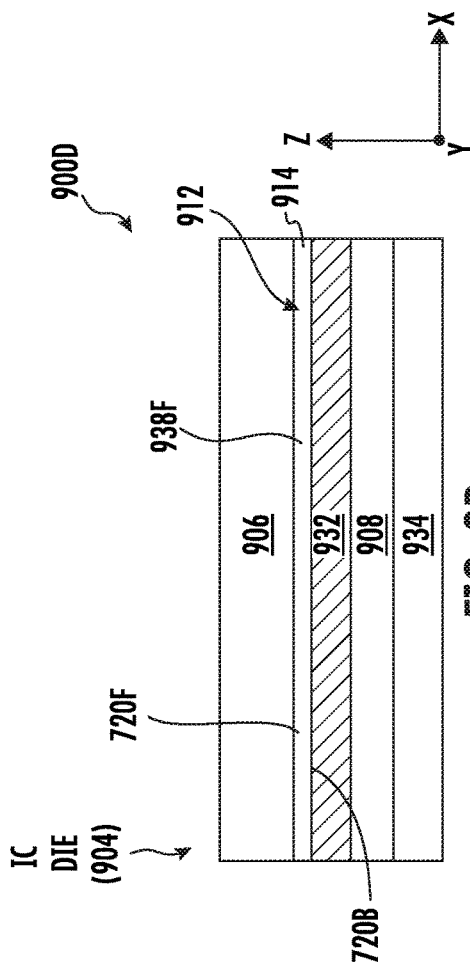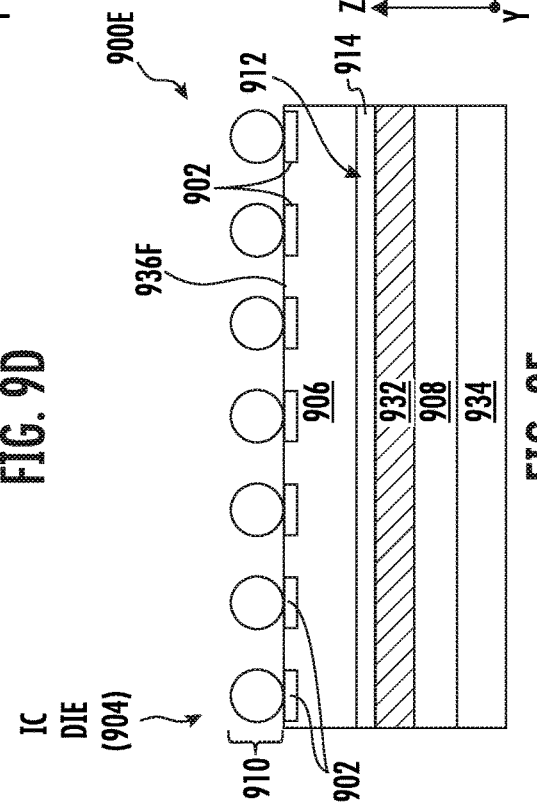

INTEGRATED CIRCUITS (ICS) EMPLOYING FRONT SIDE (FS) BACK END-OF-LINE (BEOL) (FS-BEOL) INPUT/OUTPUT (I/O) ROUTING AND BACK SIDE (BS) BEOL (BS-BEOL) POWER ROUTING FOR CURRENT FLOW ORGANIZATION, AND RELATED METHODS

BACKGROUND

I. Field of the Disclosure

The field of the disclosure relates to integrated circuits (ICs) and related IC packages that include one or more semiconductor dice attached to a package structure to provide an electrical interface to the semiconductor dice.

II. Background

Integrated circuits (ICs) are the cornerstone of electronic devices. ICs are packaged in an IC package, also called a "semiconductor package" or "chip package." The IC package includes one or more semiconductor dice as an IC(s) that are mounted on and electrically coupled to a package substrate to provide physical support and an electrical interface to the semiconductor die(s). The package substrate may be an embedded trace substrate (ETS), for example, that includes embedded electrical traces in one or more dielectric layers and vertical interconnect accesses (vias) coupling the electrical traces together to provide electrical interfaces between the semiconductor die(s). The semiconductor die(s) is mounted to and electrically interfaced to interconnects exposed in a top layer of the package substrate to electrically couple the semiconductor die(s) to the electrical traces of the package substrate for interconnections. The semiconductor die(s) and package substrate are encapsulated in a package material, such as a molding compound, to form the IC package. The IC package may also include external solder balls in a ball grid array (BGA) that are electrically coupled to interconnects exposed in a bottom layer of the package substrate to electrically couple the solder balls to the electrical traces in the package substrate. The solder balls provide an external electrical interface to the semiconductor die(s) in the IC package. The solder balls are electrically coupled to metal contacts on a printed circuit board (PCB) when the IC package is mounted to the PCB to provide an electrical interface between electrical traces in the PCB to the IC chip through the package substrate in the IC package.

SUMMARY OF THE DISCLOSURE

Aspects disclosed herein include integrated circuits (ICs) employing front side (FS) back end-of-line (BEOL) (FS-BEOL) input/output (I/O) routing and back side (BS) BEOL (BS-BEOL) power routing for current flow organization. Related IC packages and methods of fabricating the ICs and IC packages are also disclosed. The IC can be provided as an IC die. The IC includes an active or semiconductor layer of a semiconductor material that includes semiconductor devices, such as field-effect transistors (FETs), fabricated in a front end-of-line (FEOL) process. The IC can be coupled to a package metallization structure (e.g., a package substrate or redistributed layers (RDLs)) as part of an IC package. The package metallization structure can provide electrical connections between the IC and other devices electrically coupled to the package metallization structure. For example, another IC may be electrically coupled to the package metallization structure and the IC by electrical coupling the other IC to conductive bumps on the package metallization structure.

In exemplary aspects disclosed herein, to reduce routing complexity and/or shorten the I/O routing connections between the IC and the package metallization structure to provide lower I/O signal resistance, the IC includes an FS-BEOL metallization structure and a BS-BEOL metallization structure. The FS-BEOL metallization structure is a metallization structure disposed on a first, front side of the semiconductor layer of the IC. The BS-BEOL is another metallization structure disposed on a second, back side of the semiconductor layer in the IC opposite the front side of the IC. The FS-BEOL metallization structure includes one or more front side metal layers that include front side metal lines configured to route I/O signals received from the package metallization structure to the semiconductor layer of the IC. The FS-BEOL metallization structure of the IC is also configured to receive power signals to be routed in power routing lines to the semiconductor devices to provide power to the semiconductor devices in the IC. However, to avoid the need to re-route the power signals through power routing lines to semiconductor devices through the FS-BEOL metallization structure, which may increase routing density and complexity in the FS-BEOL metallization structure, the power signals are routed from the FS-BEOL metallization structure to power routing in the BS-BEOL metallization structure. In this regard, the BS-BEOL metallization structure includes one or more back side metal layers that include one or more back side metal lines as power routing lines electrically coupled to semiconductor devices to route the power signals on the back side of the semiconductor layer to the semiconductor devices for power. In this manner, additional routing of power signals in the FS-BEOL metallization structure may be avoided so as to not increase the routing density in the FS-BEOL metallization structure. Decreased routing density in the FS-BEOL metallization structure may allow for reduced routing complexity in place and routing (referred to as "PNR") of the IC, which may allow for shorter I/O signal connections for reduced I/O signal resistance as an example.

In exemplary aspects, note that power signals routed between the FS-BEOL metallization structure and the BS-BEOL metallization structure can include power signals for a positive power rail and/or a ground rail. In other further exemplary aspects, to route the power signals from the FS-BEOL metallization structure to power routing in the BS-BEOL metallization structure, one or more vertical interconnect accesses (vias) are provided and extend from the front side of the semiconductor layer and through the semiconductor layer to the back side of the semiconductor layer. The vias may be through-silica-vias (TSVs) as an example. The metal lines in the FS-BEOL metallization structure routing the power signals to the BS-BEOL metallization structure are electrically coupled to the vias. One or more back side metal lines as power routing lines in one or more back side metal layers in the BS-BEOL metallization structure are also coupled to the vias to receive the power signals from power routing in the FS-BEOL. The back side metal lines are electrically coupled to the semiconductor devices to route the power signals to the semiconductor devices to provide power to the semiconductor devices. In yet further exemplary aspects, power head switch devices are formed in the semiconductor layer and coupled between a front side metal line in the FS-BEOL metallization structure and a back side metal line in the BS-BEOL metallization structure to control the routing of power signals from the FS-BEOL metallization structure to the BS-BEOL metallization structure.

In this regard, in one exemplary aspect, an IC is provided. The IC includes a semiconductor layer including a front side and a back side opposite the front side, the semiconductor layer including a semiconductor device. The IC further includes a FS-BEOL metallization structure disposed adjacent to the front side of the semiconductor layer. The FS-BEOL metallization structure includes a front side metal line, and a front side interconnect coupled to the front side metal line. The IC further includes a BS-BEOL metallization structure disposed adjacent to the back side of the semiconductor layer, the BS-BEOL metallization structure including a back side metal line. The IC further includes a front side—back side connection structure coupled to the front side metal line and the back side metal line. The IC further includes the back side metal line coupled to the semiconductor device.

In another exemplary aspect, an IC package is provided. The IC package includes a substrate. The IC package further includes an IC die coupled to the substrate, the IC die including an active face and an inactive face. The IC die further includes a semiconductor layer including a front side and a back side opposite the front side, the semiconductor layer including a semiconductor device. The IC die further includes a FS-BEOL metallization structure disposed between the active face and the front side of the semiconductor layer. The FS-BEOL metallization structure includes a front side metal line, and a front side interconnect exposed from the active face and coupled to the front side metal line. The IC die further includes a BS-BEOL metallization structure disposed between the back side of the semiconductor layer and the inactive face. The BS-BEOL metallization structure includes a back side metal line. The IC die further includes a front side—back side connection structure coupled to the front side metal line and the back side metal line, and the back side metal line coupled to the semiconductor device. The IC package further includes a power IC coupled to the substrate.

In another exemplary aspect, a method of fabricating an IC is provided. The disposing a semiconductor layer on a substrate, the semiconductor layer including a front side and a back side opposite the front side. The method further includes forming a semiconductor device in the semiconductor layer. The method further includes forming a FS-BEOL metallization structure adjacent to the front side of the semiconductor layer, the FS-BEOL metallization structure including a front side metal line, and a front side interconnect coupled to the front side metal line. The method further includes forming a BS-BEOL metallization structure adjacent to the back side of the semiconductor layer, the BS-BEOL metallization structure including a back side metal line coupled to the semiconductor device. The method further includes forming a front side—back side connection structure coupled to the front side metal line and the back side metal line.

BRIEF DESCRIPTION OF THE FIGURES

FIGS. 6A-6C are a flowchart illustrating another exemplary process of fabricating an IC that includes a FS-BEOL metallization structure providing front side I/O signal routing to a semiconductor device(s), and a BS-BEOL metallization structure providing back side power routing to the semiconductor device(s), such as the ICs in FIGS. 1-2B and 4A-4B;

FIGS. 7A-7G are exemplary fabrication stages of an IC fabricated according to the process in FIGS. 6A-6C;

FIGS. 8A and 8B are a flowchart illustrating another exemplary process of fabricating an IC that includes a FS-BEOL metallization structure providing front-side I/O signal routing to a semiconductor device(s), and a BS-BEOL metallization structure providing back side power routing to the semiconductor device(s), such as the ICs in FIGS. 1-2B and 4A-4B;

FIGS. 9A-9E are exemplary fabrication stages of an IC fabricated according to the process in FIGS. 8A and 8B;

DETAILED DESCRIPTION

Figure 1:
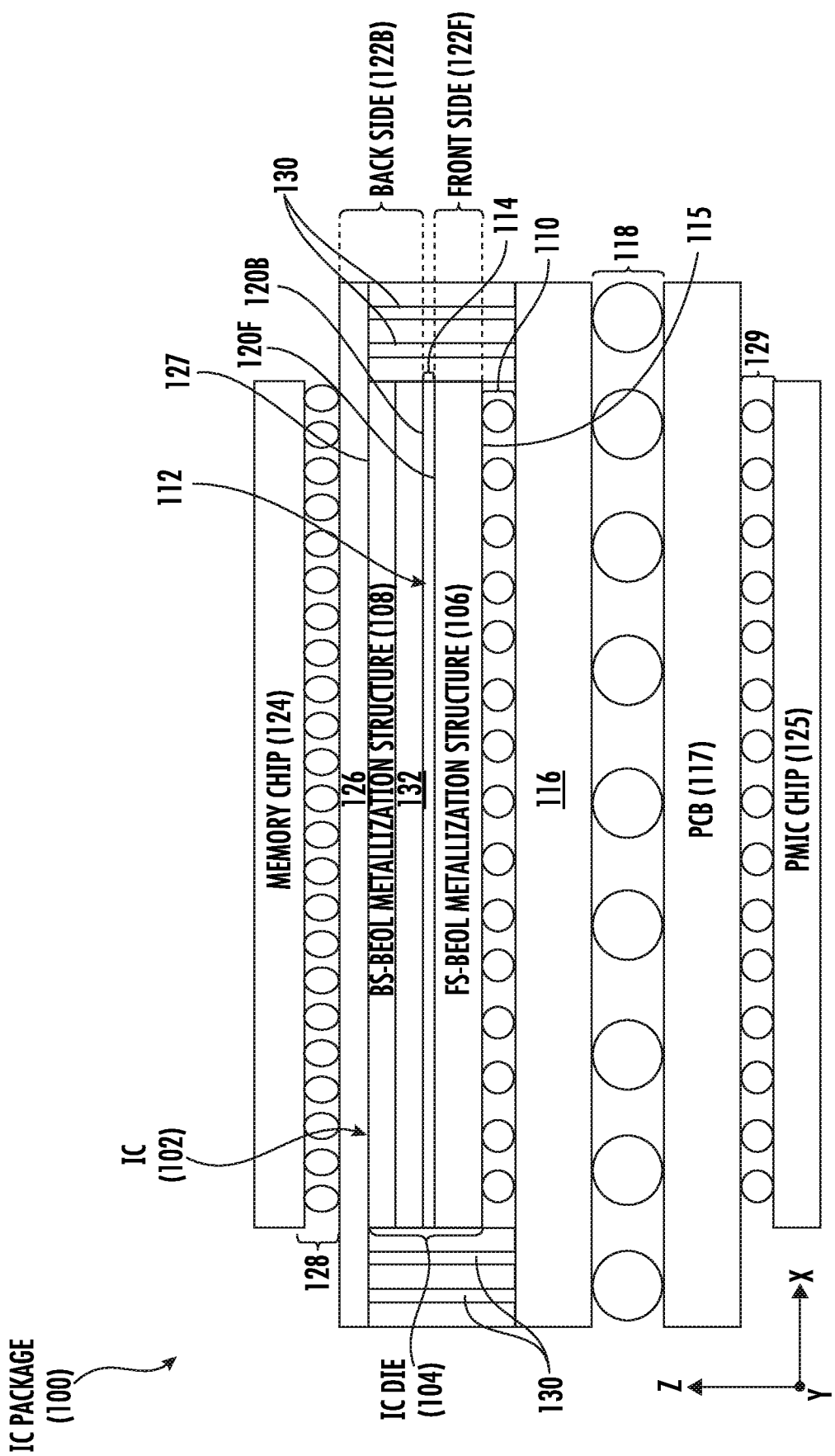
FIG. 1 is a side view of an integrated circuit (IC) package that includes an IC in the exemplary form of an IC die that includes a front side (FS) back-end-of-line (BEOL) (FS-BEOL) metallization structure providing front-side input/output (I/O) signal routing to a semiconductor device(s), and a back side (BS) BEOL (BS-BEOL) metallization structure providing back side power routing to the semiconductor device(s)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include integrated circuits (ICs) employing front side (FS) back end-of-line (BEOL) (FS-BEOL) input/output (I/O) routing and back side (BS) BEOL (BS-BEOL) power routing for current flow organization. Related IC packages and methods of fabricating the ICs and IC packages are also disclosed. The IC can be provided as an IC die. The IC includes an active or semiconductor layer of semiconductor material that includes semiconductor devices, such as field-effect transistors (FETs), fabricated in a front end-of-line (FEOL) process. The IC can be coupled to a package metallization structure (e.g., a package substrate or redistributed layers (RDLs)) as part of an IC package. The package metallization structure can provide electrical connections between the IC and other devices electrically coupled to the package metallization structure. For example, another IC may be electrically coupled to the package metallization structure and the IC by electrical coupling the other IC to conductive bumps on the package metallization structure.

In exemplary aspects disclosed herein, to reduce routing complexity and/or shorten the I/O routing connections between the IC and the package metallization structure to provide lower I/O signal resistance, the IC includes an FS-BEOL metallization structure and a BS-BEOL metallization structure. The FS-BEOL metallization structure is a metallization structure disposed on a first, front side of the semiconductor layer of the IC. The BS-BEOL is another metallization structure disposed on a second, back side of the semiconductor layer in the IC opposite the front side of the IC. The FS-BEOL metallization structure includes one or more front side metal layers that include front side metal lines configured to route I/O signals received from the package metallization structure to the semiconductor layer of the IC. The FS-BEOL metallization structure of the IC is also configured to receive power signals to be routed in power routing lines to the semiconductor devices to provide power to the semiconductor devices in the IC. However, to avoid the need to re-route the power signals through power routing lines to semiconductor devices through the FS-BEOL metallization structure, which may increase routing density and complexity in the FS-BEOL metallization structure, the power signals are routed from the FS-BEOL metallization structure to power routing in the BS-BEOL metallization structure. In this regard, the BS-BEOL metallization structure includes one or more back side metal layers that include one or more back side metal lines as power routing lines electrically coupled to semiconductor devices to route the power signals on the back side of the semiconductor layer to the semiconductor devices for power. In this manner, additional routing of power signals in the FS-BEOL metallization structure may be avoided so as to not increase the routing density in the FS-BEOL metallization structure. Decreased routing density in the FS-BEOL metallization structure may allow for reduced routing complexity in place and routing (referred to as "PNR") of the IC, which may allow for shorter I/O signal connections for reduced I/O signal resistance as an example.

In this regard, FIG. 1 is a side view of an IC package 100 that includes an IC 102 in the exemplary form of an IC die 104. For example, the IC 102 may be a processor circuit, memory circuit, logic circuit, or any combination thereof. The IC 102 can be used in an electronic device application, such as a computing device for example. As discussed in more detail below, the IC die 104 includes a FS-BEOL metallization structure 106 and a BS-BEOL metallization structure 108. The FS-BEOL metallization structure 106 is a metallization structure that includes one or more metal layers that include metal lines for carrying I/O signals for providing front side I/O signal routing between one or more die interconnects 110 (e.g., solder bumps, ball grid array (BGA)) and one or more semiconductor devices 112 formed in a semiconductor layer 114. The die interconnects 110 are on an active face 115 of the IC die 104. The FS-BEOL metallization structure 106 is disposed on a first side of the semiconductor layer 114 of the IC 102 to form interconnections to the semiconductor devices 112 after being formed in the semiconductor layer 114 in a front-end-of-line (FEOL) process. For example, the semiconductor devices 112 may be field-effect transistors (FETs) that are configured to operate based on the state of I/O signals coupled to their gates, sources, and/or drains. The FETs may be part of complementary metal-oxide semiconductor (CMOS) circuits that are formed in the semiconductor layer 114 as positive (P)-type FETs (PFETs) and negative (N)-type FETs (NFETs). Another circuit can be electrically interfaced to communicate I/O signals with the semiconductor devices 112 in the IC die 104 of the IC package 100 through a package substrate 116. The package substrate 116 may be a laminated substrate or a redistribution layers (RDL) substrate as examples. The package substrate 116 is mounted to a printed circuit board (PCB) 117 through external conductive bumps 118 (e.g., solder bumps, ball grid array (BGA)) that are electrically coupled to metal lines in the package substrate 116 also coupled to the die interconnects 110 (e.g., solder bumps, ball grid array (BGA)) to provide a conductive routing path between the external conductive bumps 118 and the semiconductor devices 112 in the IC die 104.

By "front side" of the FS-BEOL metallization structure 106, which is also represented herein as "FS," it is meant that the FS-BEOL metallization structure 106 is disposed adjacent to a front side 120F of the semiconductor layer 114. In FIG. 1, the FS-BEOL metallization structure 106 is disposed adjacent to the front side 120F of the semiconductor layer 114 in the Z-axis direction. The IC die 104 in FIG. 1 has been flipped such that the FS-BEOL metallization structure 106 is disposed beneath and adjacent to a front side 120F of the semiconductor layer 114 in the Z-axis direction in this example, which is on a front side 122F of IC die 104. The BS-BEOL metallization structure 108 is disposed above and adjacent to the semiconductor layer 114 in the Z-axis direction in this example, which is on a back side 122B of the IC die 104.

In the example of the IC package 100 in FIG. 1, a separate memory chip 124 (i.e., memory IC) is interfaced to the IC die 104 to communicate I/O signals with the IC die 104 for memory accesses (i.e., read and write operations). The memory chip 124 is coupled to a second package substrate 126 and the package substrate 116 through external conductive bumps 128 coupled to vertical interconnect accesses (vias) 130, which may be conductive pillars for example. The BS-BEOL metallization structure 108 is disposed adjacent to the second package substrate 126. An inactive face 127 of the IC die 104 is disposed adjacent to the second package substrate 126. In this example, the FS-BEOL metallization structure 106 of the IC die 104 supports the front side routing of I/O signals from the memory chip 124 (through the conductive bumps 128, the second package substrate 126, vias 130, the package substrate 116, and die interconnects 110) to semiconductor devices 112 in the IC die 104. The FS-BEOL metallization structure 106 is designed to provide sufficient conductive paths in metal lines in metal layers therein to provide I/O signal routing between the memory chip 124 and the IC die 104 in this example.

With continuing reference to FIG. 1, as introduced above, the IC die 104 also includes the BS-BEOL metallization structure 108. The BS-BEOL metallization structure 108 is a metallization structure that includes one or more metal layers disposed on a second side of the semiconductor layer 114 opposite of the side on which the FS-BEOL metallization structure 106 is disposed. The metal layers of the BS-BEOL metallization structure 108 each have metal lines for making interconnections to the semiconductor devices 112. The BS-BEOL metallization structure is disposed adjacent to a back side 120B of the semiconductor layer 114. By "back side" of the BS-BEOL metallization structure 108, which is also represented herein as "BS," it is meant that the BS-BEOL metallization structure 108 is disposed adjacent to the back side 120B of the semiconductor layer 114. In FIG. 1, the BS-BEOL metallization structure 108 is disposed adjacent to the back side 120B of the semiconductor layer 114 in the Z-axis direction. A substrate 132 on which the semiconductor layer 114 is formed is disposed between the BS-BEOL metallization structure 108 and the semiconductor layer 114 in this example. The IC die 104 in FIG. 1 has been flipped such that the BS-BEOL metallization structure 108 is disposed above the semiconductor layer 114 in the X-axis direction in this example, which is deemed to be adjacent to the back side 122B of the IC die 104.

As discussed in more detail below, the BS-BEOL metallization structure 108 includes one or more metal layers that include metal lines for carrying power signals (e.g., a positive and/or negative voltage signal and/or ground signal) for providing back side power routing between the one or more die interconnects 110 (e.g., solder bumps) and one or more semiconductor devices 112 formed in the semiconductor layer 114. Power routing involves metal lines configured to carry a power signal. For example, the semiconductor devices 112 may require power to operate. In the example of FETs as semiconductor devices 112, a power signal may need to be coupled to a gate, source, and/or drain of the FET for its desired function and operation. As shown in FIG. 1, a power management IC (PMIC) chip 125 (i.e., a power IC) may be coupled to the PCB 117 through conductive bumps 129. Power signals from the PMIC chip 125 can be routed through the PCB 117 and package substrate 116 and through the conductive bumps 118 to the IC die 104 and FS-BEOL metallization structure 106 to then be routed to the BS-BEOL metallization structure 108.

In this example, as will be discussed in more detail below, the FS-BEOL metallization structure 106 includes conductive routing paths to provide power signals received through the external conductive bumps 118 and package substrate 116 to the BS-BEOL metallization structure 108. The power signals can then be routed through metal lines within metal layers of the BS-BEOL metallization structure 108 on the back side 120B of the semiconductor layer 114 so that power signals can be coupled to the semiconductor devices 112 therein from the back side 122B of the IC die 104. Thus, the power signals are not routed directly to the semiconductor devices 112 from the FS-BEOL metallization structure 106, but rather the BS-BEOL metallization structure 108. The power signals can be routed through a back side power distribution network of metal lines in the BS-BEOL metallization structure 108 coupled to the semiconductor devices 112 to provide power to a number of semiconductor devices 112 in the IC die 104 for operation. For example, in CMOS circuits, it is common to provide positive power signals to a source of a pull-up PFET and a ground signal to a pull-down NFET to provide logic operations. Thus, by providing back side routing of power signals in the BS-BEOL metallization structure 108, complex routing of power signals in the FS-BEOL metallization structure 106 can be avoided so as to not increase the routing density in the FS-BEOL metallization structure 106. Decreased routing density in the FS-BEOL metallization structure 106 may allow for reduced routing complexity in place and routing, which may allow for shorter I/O signal connections for reduced I/O signal resistance as an example. For example, reduced routing complexity in the FS-BEOL metallization structure 106 may allow I/O routing connections between the semiconductor devices 112 and the package substrate 116 to be reduced in length due to providing lower I/O signal resistance for the IC die 104.

Because the IC die 104 may have different power domains for powering semiconductor devices 112, the BS-BEOL metallization structure 108 may include multiple power distribution networks for routing power for different power domains. For example, the IC die 104 may include a CPU and memory circuits. The CPU may be configured to operate at a first power domain that can be lowered to a lower voltage level than a second power domain powering the memory circuits. For example, the memory circuit may require a minimum power level to retain data storage. To conserve power, it may be desired to lower or collapse power to the CPU in an idle or power down mode without affecting the power provided to the memory circuits. Providing multiple separate power domains to the CPU and memory circuits allows this functionality.

With continuing reference to FIG. 1, another circuit can be electrically interfaced to communicate power signals with the semiconductor devices 112 in the IC die 104 of the IC package 100 through the package substrate 116. For example, power signals can be routed to the IC die 104 through the external conductive bumps 118 (e.g., solder bumps, ball grid array (BGA)) that are electrically coupled to metal lines in the package substrate 116. The external conductive bumps 118 are coupled to the die interconnects 110 (e.g., solder bumps) to provide a conductive routing path between the external conductive bumps 118 and the semiconductor devices 112 in the IC die 104. For example, the IC package 100 could be mounted in a printed circuit board with another power management IC (PMIC) such that the PMIC is electrically coupled to the IC die 104 through the conductive bumps 118 to provide power signals to the IC die 104 through the FS-BEOL metallization structure 106, and to the BS-BEOL metallization structure 108 to be coupled to the semiconductor devices 112. A PMIC or other circuit could also be integrated into the IC package 100 and coupled to the IC die 104, such as being mounted on the second package substrate 126 like the memory chip 124.

Figure 2A:
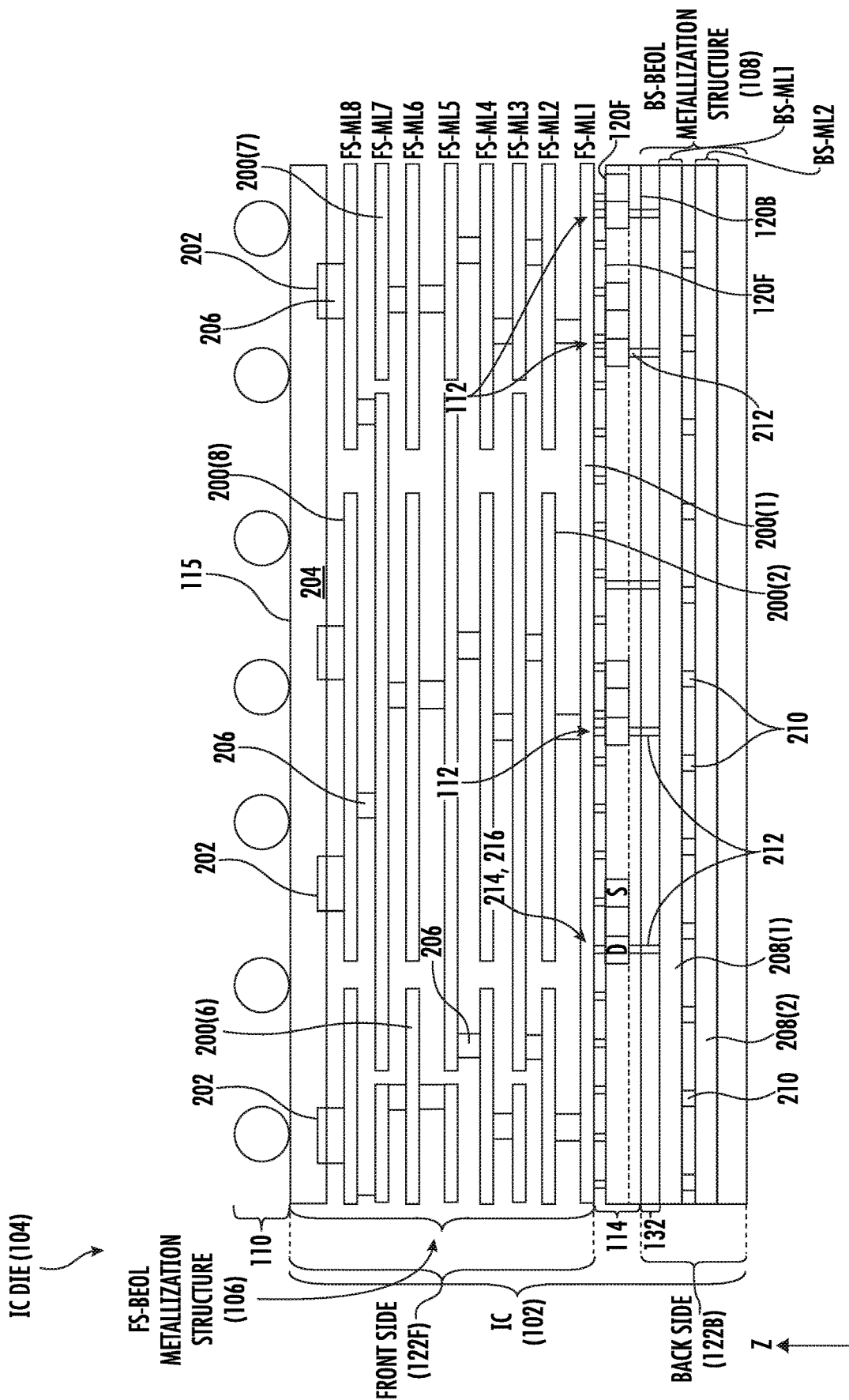
FIG. 2A is a more detailed side view of the IC in the IC package in FIG. 1.
Figure 2B:
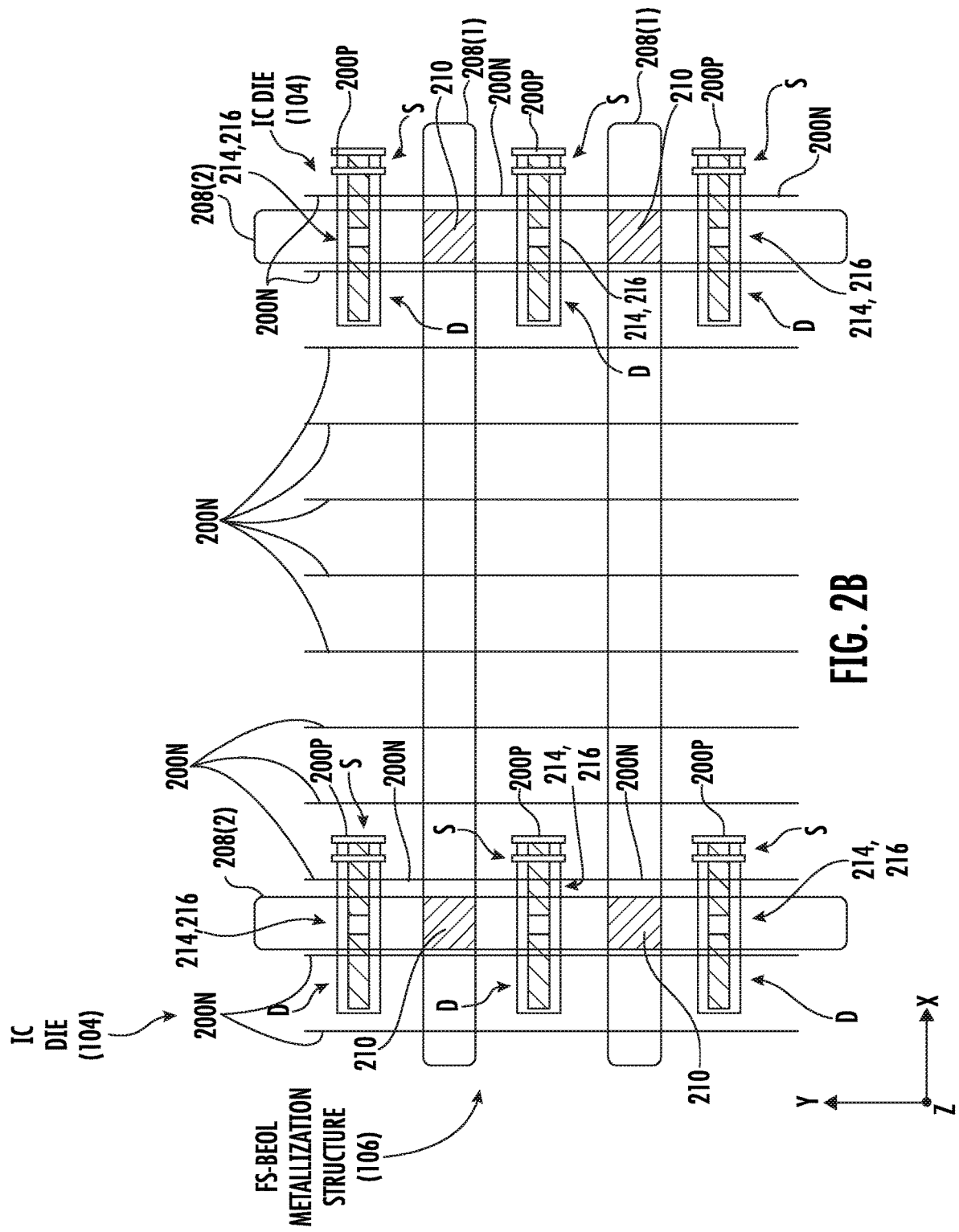
FIG. 2B is a top view of the IC in the IC package in FIG. 1.

FIGS. 2A and 2B are a more detailed side view and top view, respectively, of the IC 102 in the IC package 100 in FIG. 1 to explain more exemplary detail of the IC die 104 and the FS-BEOL metallization structure 106 and BS-BEOL metallization structure 108. As discussed above, the FS-BEOL metallization structure 106 supports front side I/O signal routing for the IC die 104, and the BS-BEOL metallization structure 108 supports back side power routing for the IC die 104.

With reference to FIG. 2A, the FS-BEOL metallization structure 106 is shown as including eight (8) front side metal layers FS-ML1-FS-ML8, but note that such is not limiting. Each front side metal layer FS-ML1-FS-ML8 includes one or more front side metal lines 200(1)-200(8) fabricated in the FS-BEOL metallization structure 106 to provide conductive routing paths for signals through the FS-BEOL metallization structure 106. The front side metal lines 200(8)

in the upper or top most front side metal layer FS-ML8 are coupled to front side interconnects 202 in a front side interconnect layer 204 that are coupled to the die interconnects 110 to provide conductive routing paths between the die interconnects 110 and the front side metal lines 200(8) in the front side metal layer FS-ML8. The front side interconnects 202 in the front side interconnect layer 204 are exposed from the active face 115 of the IC die 104 and coupled to the die interconnects 110. For example, as discussed above, the front side interconnects 202 are configured to receive I/O signals to be routed in the FS-BEOL metallization structure 106 to semiconductor devices 112 in the semiconductor layer 114. The front side interconnects 202 are also configured to receive power signals to be routed in the FS-BEOL metallization structure 106 to the BS-BEOL metallization structure 108 on the back side 122B of the IC die 104 to be coupled to semiconductor devices 112 in the semiconductor layer 114. Vias 206 are provided in the front side metal layer FS-ML1-FS-ML8 between adjacent front side metal lines 200(1)-200(8) to electrically couple certain front side metal lines 200(1)-200(8) together to create signal routing paths in the FS-BEOL metallization structure 106 according to the place and route design of the IC 102.

With continuing reference to FIG. 2A, the BS-BEOL metallization structure 108 is shown as including two (2) back side metal layers BS-ML1, BS-ML2, but note that such is not limiting. Each back side metal layer BS-ML1, BS-ML2 includes one or more back side metal lines 208(1), 208(2) fabricated in the BS-BEOL metallization structure 108 to provide conductive routing paths for power signals through the BS-BEOL metallization structure 108. The back side metal lines 208(1), 208(2) provide for a power distribution network for carrying power signals to be distributed to semiconductor devices 112 in the semiconductor layer 114 of the IC die 104. The back side metal line 208(2) is coupled to back side metal line 208(1) through back side vias 210. In this example, the back side metal line 208(1) is coupled to the back side of semiconductor devices 112 formed in the semiconductor layer 114 through back side vias 212. The back side vias 212 may be through-silica vias (TSVs) as an example, because the back side vias 212 extend through the semiconductor layer 114. In another example, the back side vias 212 could extend into the front side 122F of the IC die 104 through the front side 120F of the semiconductor layer 114 and coupled to a front side metal line 200(1)-200(8) to then be routed for routing a power signal. Also, one back side metal line 208(1) could be for routing a positive power signal and the other back side metal line 208(2) for routing a negative power signal or ground signal.

For example, as discussed above, the front side interconnects 202 are configured to receive I/O signals to be routed in the FS-BEOL metallization structure 106 to semiconductor devices 112 in the semiconductor layer 114. The front side interconnects 202 are also configured to receive power signals to be routed in the FS-BEOL metallization structure 106 to the BS-BEOL metallization structure 108 on the back side 122B of the IC die 104 to be coupled to semiconductor devices 112 in the semiconductor layer 114. Vias 206 are provided in the front side metal layers FS-ML1-FS-ML8 between adjacent front side metal lines 200(1)-200(8) to electrically couple certain front side metal lines 200(1)-200(8) together to create signal routing paths in the FS-BEOL metallization structure 106 according to the place and route design of the IC 102.

FIG. 2B illustrates a top view of the IC die 104 in FIG. 2A. As shown in FIG. 2A, power signals that are received from a die interconnect 110 and into the FS-BEOL metallization structure 106 are routed to the BS-BEOL metallization structure 108 for further distribution. In this regard, the IC die 104 includes front side—back side connection structures 214 to couple front side metal lines 200P, 200N in the FS-BEOL metallization structure 106 to a back side metal line 208(1) in the BS-BEOL metallization structure 108. As shown in FIG. 2B, a top view of front side metal lines 200P, 200N in the FS-BEOL metallization structure 106 extend down to the front side—back side connection structures 214 to route power signals to the front side—back side connection structures 214. In one example, the front side—back side connection structures 214 are head switches in the form of a FET 216. The FET 216 includes a drain D and a source S in this example. The front side metal lines 200P located above the FETs 216 in the Z-axis direction are to efficiently route positive power signals to the source S and/or drain D of the FET 216 in thus example. Also, as shown in FIG. 2B, the front side metal lines 200N are provided to route ground or negative power signals in the FS-BEOL metallization structure 106 to a ground network in the BS-BEOL metallization structure 108.

With reference back to FIG. 2A, in this example, the source S of the FET 216 is coupled to the front side metal line 200P, and the drain D of the FET 216 is coupled to the back side metal line 208(1). The front side metal line 200P is coupled to other front side metal lines 200(2)-200(8) coupled by vias 206 in the FS-BEOL metallization structure 106 to a die interconnect 110 carrying a power signal so that the source S of the FET 216 is configured to receive a power signal. The drain D of the FET 216 is coupled to the back side metal line 208(1) through a via 212. In this manner, the power signals received from the die interconnect 110 are routed from the FS-BEOL metallization structure 106 to the BS-BEOL metallization structure 108 to be distributed. The power signals can then be routed to the other semiconductor devices 112 through the BS-BEOL metallization structure 108 by a coupling of the back side metal line 208(1) to the FET 216 on the back side 122B of the IC die 104.

Note that by providing power routing in the BS-BEOL metallization structure 108 of the IC package 100 on the back side of the IC die 104, side-channel attacks into the IC package 100 may be reduced and/or avoided. A side-channel attack is where a separate device is coupled to the IC package to attempt to monitor power consumption and/or electro-magnetic (EM) emissions by the IC die 104 while the IC die 104 is operational. For example, a side-channel attack may be used to attempt to gather data and other secret information processed by the IC die 104. To perform a side-channel attack on the IC package 100 in FIG. 1, a monitoring probe may be connected to the externally accessible conductive bumps 118 of IC package 100 mounted to the PCB 117 to try to determine information about processing of signals in the IC die 104. By providing the power routing networks for the IC die 104 in the BS-BEOL metallization structure 108 that is disposed between the second package substrate 126 and the package substrate 116, it is more difficult if not impossible to provide a side-channel attack into the power distribution network through the conductive bumps 118 exposed from the IC package 100 on the PCB 117. Only the main power signals are routed through the conductive bumps 118 to the FS-BEOL metallization structure 106. The BS-BEOL metallization structure 108 may then further process the power signals routed in the FS-BEOL metallization structure 106 into multiple power domain signals to be routed to different power domains in the IC die 104. These multiple power domains are not directly accessible through the conductive bumps 118 and the FS-BEOL metallization structure 106.

Figure 3A:
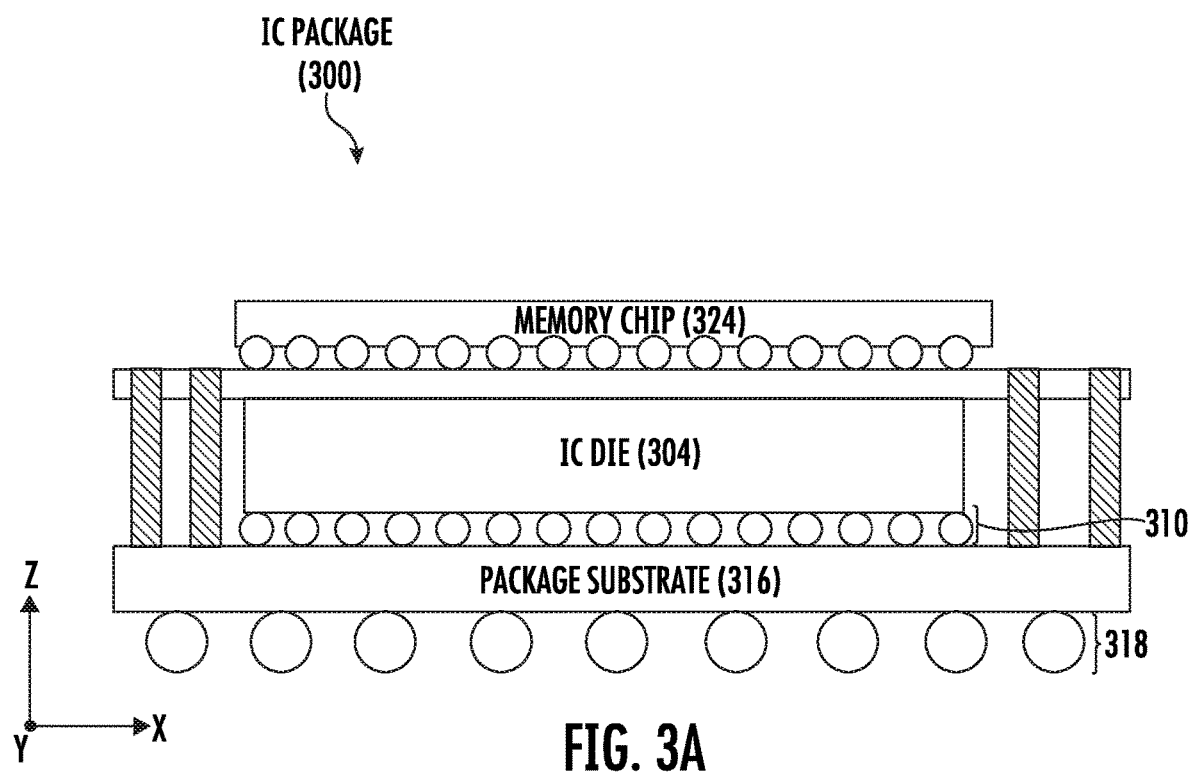
FIGS. 3A and 3B are side views of an IC package and an IC in the IC package, respectively, wherein the IC includes a FS-BEOL metallization structure for routing I/O signals and power signals to the IC die.
Figure 3B:
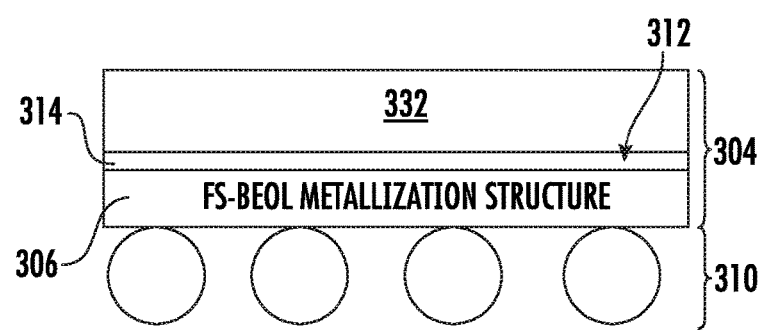

FIGS. 3A and 3B are side views of an IC package 300, memory chip 324, and IC die 304 that does not include back side power routing for comparison purposes to the IC package 100 in FIGS. 1-2B. As shown in FIGS. 3A and 3B, the IC package 300 includes the IC die 304 mounted on a package substrate 316 via conductive bumps 310. The IC die 104 can be interconnected to another circuit via conductive bumps 318. As shown in FIG. 3B, the IC die 304 includes a FS-BEOL metallization structure 306 electrically coupled to the conductive bumps 310 and to a semiconductor layer 314 mounted on a substrate 332. Semiconductor devices 312 are formed in the semiconductor layer 314. Because the IC die 304 only includes the one metallization structure, the FS-BEOL metallization structure 306, both power and I/O signals are routed through the FS-BEOL metallization structure 306 to the semiconductor layer 314. Thus, the signal routing complexity in the FS-BEOL metallization structure 306 may be more complex than the signal routing in the FS-BEOL metallization structure 106 in the IC die 104 in FIGS. 1-2B, because the power routing is coupled to each of the semiconductor devices 312 that require power through the FS-BEOL metallization structure 306 that also routes the I/O signals.

Figure 4A:
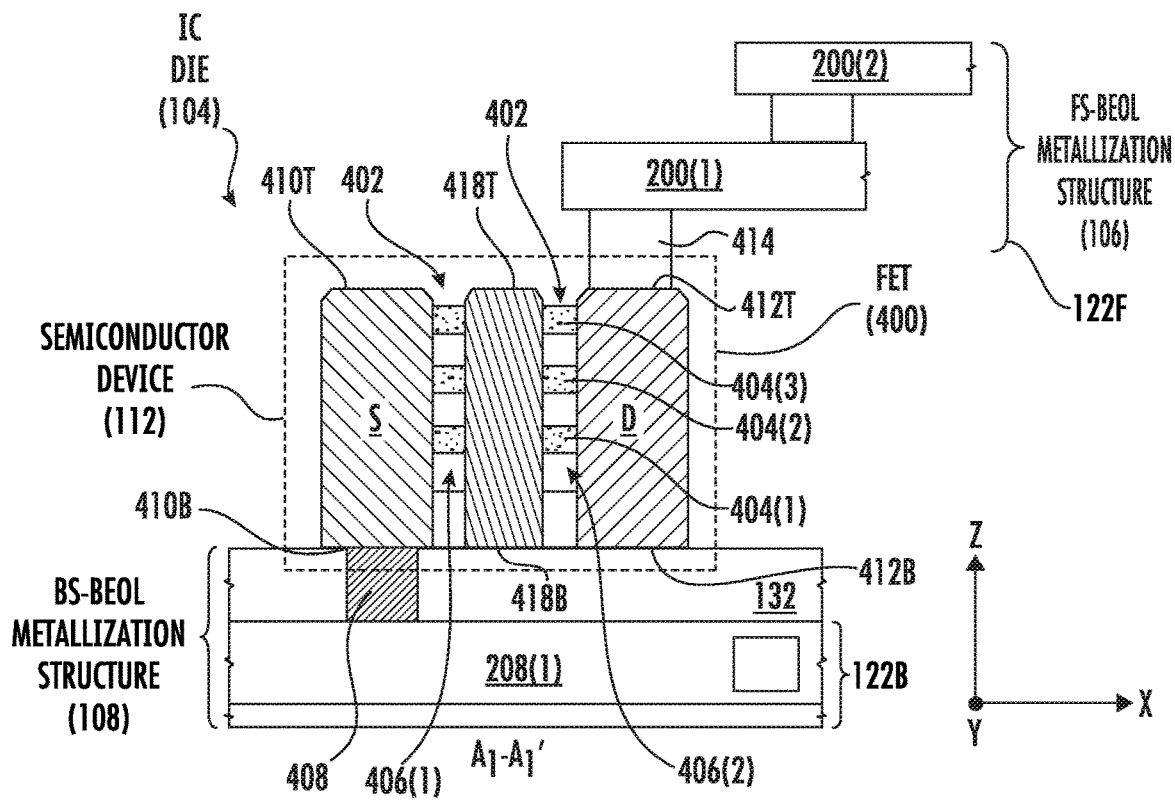
FIGS. 4A and 4B are respective cross-sectional side and bottom views of an exemplary IC in the exemplary form of an IC die that includes field-effect transistors (FETs), front side routing of I/O signals in a FS-BEOL metallization structure to the FET, and back side routing of power signals in a BS-BEOL metallization structure to the FET.
Figure 4B:
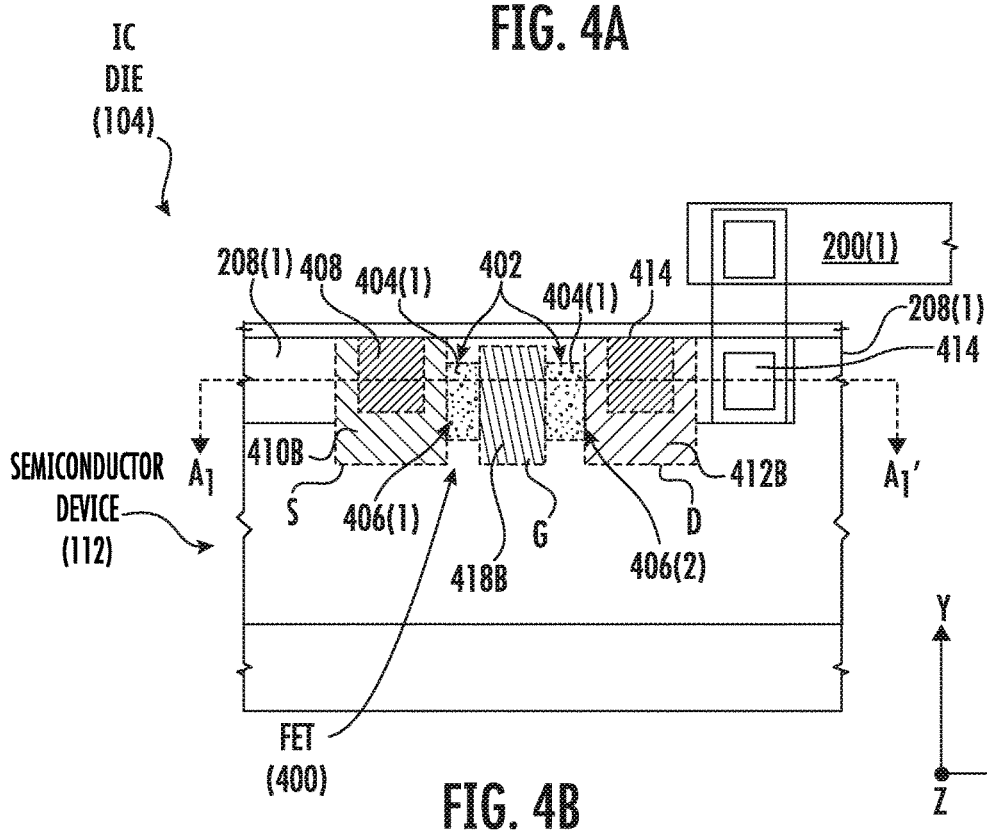

As discussed above with regard to FIGS. 1-2A, a back side metal line 208(1) in the BS-BEOL metallization structure 108 in the IC die 104 is coupled to a semiconductor device 112 in the semiconductor layer 114 to route power to the semiconductor device 112. In this regard, as an example, FIGS. 4A and 4B are additional, respective cross-sectional side and bottom views of the IC die 104 in FIGS. 1A-2A that includes field-effect transistors (FETs) as semiconductor devices 112. FIG. 4A is a cross-sectional side view of the IC die 104 in FIG. 4A along the $A_1$-$A_1'$ cross-section line. FIGS. 4A and 4B show an example of how front side I/O signal routing from the FS-BEOL metallization structure 106 and back side power routing from the BS-BEOL metallization structure 108 can be coupled to a semiconductor device 112.

With reference to FIGS. 4A and 4B, the IC die 104 includes a FET 400. The FET 400 is a gate-all-around (GAA) FET in this example, but note that the FET 400 could be a planar FET or a FinFET as other non-limiting examples. A GAA FET is also known as a surrounding-gate transistor (SGT), and is similar in concept to a FinFET except that the gate material surrounds the channel region on all sides. A FinFET is a multigate a MOSFET (metal-oxide-semiconductor field-effect transistor) built on a substrate where the gate is placed on two, three, or four sides of the channel or wrapped around the channel, forming a double gate structure. A planar FET includes a conduction channel formed in a substrate where a gate is placed above the conduction channel with an insulating material therebetween. The FET 400 includes a conduction channel 402 that is disposed above the substrate 132, which is a bulk substrate in this example, in the Z-axis direction. A plurality of nanostructures 404(1)-404(3) (e.g., nanowires or nanoslabs) is provided that may have been formed from the substrate 132 and are of a semiconductor material to be able to conduct current in response to an electric field. A bulk substrate is a free-standing substrate. The FET 400 includes the source S that is disposed in a first end portion 406(1) of the conduction channel 402. In this example, a back side metal contact 408 is also below the conduction channel 402. In this example, by the back side metal contact 408 being below the substrate 132 in the Z-axis, the back side metal contact 408 is also below the conduction channel 402 since the FET 400 in this example is a GAA FET where the conduction channel 402 is disposed above the substrate 132. If, for example, the FET 400 was a planar FET where the conduction channel 402 was disposed below a gate and in a substrate, a back side metal line could be below the conduction channel 402 of the planar FET, but may not be completely below the substrate.

The FET 400 also includes the drain D that is disposed on a second end portion 406(2) of the conduction channel 402 opposite the first end portion 406(1) in the X-axis direction. A gate G of the FET 400 is disposed above at least a portion of the conduction channel 402 between the first end portion 406(1) and the second end portion 406(2) of the conduction channel 402. In this example, the gate G is comprised of a gate material that surrounds each of the nanostructures 404(1)-404(3) of the conduction channel 402. In this manner, a voltage applied between the gate G and source S of the FET 400 can create an electric field in the conduction channel 402 sufficient to cause the nanostructures 404(1)-404(3) of the conduction channel 402 to conduct current between the source S and the drain D.

With continuing reference to FIG. 4A, in this example, the source S has a source top surface 410T and a source bottom surface 410B, and the drain D has a drain top surface 412T and a drain bottom surface 412B. For example, the source S and drain D may have been epitaxially grown on the substrate 132 or formed as an implant into the substrate 132. In this example, a front side metal contact 414 is in contact with the drain top surface 412T of the drain D of the FET 400 to provide connectivity between the drain D and a front side metal line 200(1) in the FS-BEOL metallization structure 106. For example, the front metal contact 414 may be a conductive pillar or via that connects the front metal contact 414 to the front side metal line 200(1). For example, the front metal contact 414 may be a through-silica-via (TSV) or other via that is of sufficiently small diameter to connect the front metal contact 414 to the front side metal line 200(1) without disturbing adjacent routing areas. Also in this example, the back side metal contact 408 is in contact with the source bottom surface 410B of the source S of the FET 400 to provide connectivity between the source S and the back side metal line 208(1). For example, the back side metal contact 408 may be a conductive pillar or via that connects the back side metal contact 408 to the back side metal line 208(1) in the BS-BEOL metallization structure 108. For example, the back side metal contact 408 may be a TSV or other via that is of sufficiently small diameter to connect the back side metal contact 408 to the back side metal line 208(1) without disturbing adjacent routing areas.

Note that although the FET 400 in FIGS. 4A and 4B shows the source S connected to the back side metal line 208(1) for back side routing of power signals to the source S, and the drain D connected to the front side metal line 200(1) for front side routing of I/O signals to the drain D, such is not limiting. As another example, the drain D of the FET 400 could be connected to the back side metal line 208(1) for back side routing of power signals to the drain D, and the source S could be connected to the front side metal line 200(1) for front side routing of I/O signals to the source S of the FET 400. Further, the source S and/or the drain D of the FET 400 could be connected by both front and back side routing if desired, for I/O signal and/or power routing. Further, the gate G of the FET 400 could be connected to a front side metal contact and/or a back side metal contact to provide gate connectivity to a front side and/or back side metal line for I/O signal and/or power routing. The gate G of the FET 400 includes a gate top surface 418T that could be connected to a front side metal contact and a gate bottom surface 418B that could be connected to a back side metal contact to provide topside and/or backside routing to the gate G.

Figure 5:
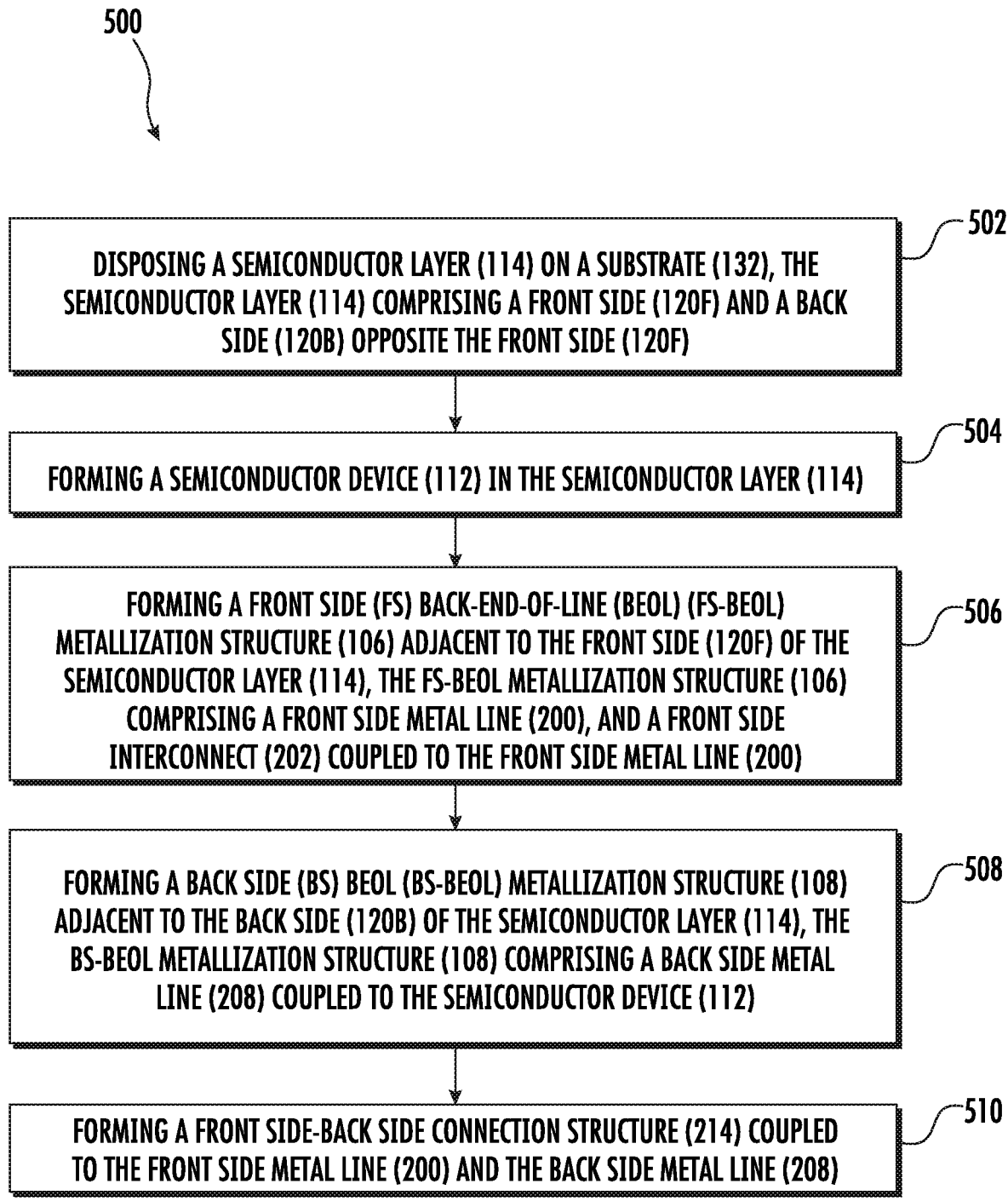
FIG. 5 is a flowchart illustrating an exemplary process of fabricating an IC that includes a FS-BEOL metallization structure providing front-side I/O signal routing to a semiconductor device(s), and a BS-BEOL metallization structure providing back side power routing to the semiconductor device(s), such as the ICs in FIGS. 1-2B and 4A-4B.

FIG. 5 is a flowchart illustrating an exemplary process 500 of fabricating an IC, such as the IC 102 in FIGS. 1-2B and 4A-4B that includes a FS-BEOL metallization structure providing front-side I/O signal routing to a semiconductor device(s), and a BS-BEOL metallization structure providing back side power routing to the semiconductor device(s). The process 500 in FIG. 5 will be discussed below in regard to the IC 102 in FIGS. 1-2B and 4A-4B as an example.

The process 500 includes disposing a semiconductor layer 114 on a substrate 132, the semiconductor layer 114 comprising a front side 120F and a back side 120B opposite the front side 120F (block 502 in FIG. 5). The process 500 also includes forming the semiconductor device 112 in the semiconductor layer 114 (block 504 in FIG. 5). The process 500 also includes forming the FS-BEOL metallization structure 106 adjacent to the front side 120F of the semiconductor layer 114, the FS-BEOL metallization structure 106 comprising a front side metal line 200, and a front side interconnect 202 coupled to the front side metal line 200 (block 506 in FIG. 5). The process 500 also includes forming the BS-BEOL metallization structure 108 adjacent to the back side 120B of the semiconductor layer 114, the BS-BEOL metallization structure 108 comprising the back side metal line 208 coupled to the semiconductor device 112 (block 508 in FIG. 5). The process also includes forming the front side—back side connection structure 214 coupled to the front side metal line 200 and the back side metal line 208 (block 510 in FIG. 5).

FIGS. 6A-6C are a flowchart illustrating another exemplary process 600 of fabricating an IC that includes a FS-BEOL metallization structure providing front-side I/O signal routing to a semiconductor device(s), and a BS-BEOL metallization structure providing back side power routing to the semiconductor device(s). The process 600 in FIGS. 6A-6C can be used to fabricate an IC, like the IC 102 in FIGS. 1-2A and 4A-4B as examples. FIGS. 7A-7G are exemplary fabrication stages of an IC fabricated according to the process in FIGS. 6A-6C. As discussed below, in the fabrication process 600 in FIGS. 6A-6C, a FS-BEOL metallization structure is formed before the BS-BEOL metallization structure is formed. This involves forming two carrier wafers in the process of forming the IC, so that there is sufficient mechanical stability for the FS-BEOL metallization structure and the BS-BEOL metallization structure disposed on opposite sides of a semiconductor layer to be processed.

The process 600 in FIGS. 6A-6C and the exemplary fabrication stages of an IC fabricated in FIGS. 7A-7G are described below in reference to each other. The reference to elements below in the process 600 in FIGS. 6A-6C and the fabrication stages in FIGS. 7A-7G of an IC fabricated according to the process 600 in FIGS. 6A-6C use the same or similar element names as in the IC package 100 and its IC 102 in FIGS. 1-2B and 4A-4B. The discussion of examples of these elements in FIGS. 1-2B and 4A-4B is also applicable to the fabrication stages of the IC in FIGS. 7A-7G.

In this regard, the process 600 includes disposing a semiconductor layer 714 on a substrate 732 as shown in the fabrication stage 700A in FIG. 7A. The semiconductor layer 714 includes a front side 720F and a back side 720B opposite the front side 720F (block 602 in FIG. 6A). Semiconductor devices 712 are formed in the semiconductor layer 714. The process 600 also includes forming a FS-BEOL metallization structure 706 on the front side 720F of the semiconductor layer 714 before forming a BS-BEOL metallization structure adjacent to the back side 720F of the semiconductor layer 714, as shown in fabrication stage 700A in FIG. 7A (block 602 in FIG. 6A). The FS-BEOL metallization structure 706 facilitates I/O routing, and power routing to a later BS-BEOL metallization structure to route power signals. A next step in the process 600 is to form a carrier wafer 734 on a front side 736F of the FS-BEOL metallization structure 706 as shown in fabrication stage 700B in FIG. 7B (block 604 in FIG. 6A). This is so that the fabrication stage 600B can be manipulated to allow a back side 738B of the substrate 732 to be grinded down for preparing an IC as shown in the fabrication stage 700C in FIG. 7C (block 606 in FIG. 6C).

With reference to FIG. 6B, a next step in the process 600 is to form a BS-BEOL metallization structure for the IC to facilitate power routing. In this regard, the process 600 includes forming a BS-BEOL metallization structure 708 adjacent to a back side 736B of the semiconductor layer 714, as shown in fabrication stage 700D in FIG. 7D (block 608 in FIG. 6B). The process 600 then involves forming a second carrier wafer 742 on a back side 740B of the BS-BEOL metallization structure 708, as shown in fabrication stage 700E in FIG. 7E (block 610 in FIG. 6B). This is so that the BS-BEOL metallization structure 708 can be processed with mechanical stability. Also, the second carrier wafer 742 may allow the fabrication stage 700E to be manipulated to have stability to remove first carrier water 734 for preparing an IC to form an IC die 704, as shown in the fabrication stage 700F in FIG. 7F (block 612 in FIG. 6C). The carrier wafer 734 is removed to allow access to the FS-BEOL metallization structure 706 to form conductive bumps coupled to the FS-BEOL metallization structure 706 to provide signal access to the semiconductor devices 712 formed in the semiconductor layer 714. The process 600 then includes forming a plurality of conductive bumps 710 on the front side 736F of the FS-BEOL metallization structure 706, wherein at least one conductive bump 710 is coupled to a front side interconnect 702 of the FS-BEOL metallization structure 706 to provide the IC die 704, as shown in fabrication stage 700G in FIG. 7G (block 614 in FIG. 6C).

FIGS. 8A and 8B are a flowchart illustrating another exemplary process 800 of fabricating an IC that includes a FS-BEOL metallization structure providing front-side I/O signal routing to a semiconductor device(s), and a BS-BEOL metallization structure providing back side power routing to the semiconductor device(s). The process 800 in FIGS. 8A and 8B can be used to fabricate an IC, like the IC 102 in FIGS. 1-2A and 4A-4B as examples. FIGS. 9A-9E are exemplary fabrication stages of an IC fabricated according to the process in FIGS. 8A and 8B. As discussed below, in the fabrication process 800 in FIGS. 8A and 8B, a BS-BEOL metallization structure is formed before the FS-BEOL metallization structure is formed. This involves forming a single carrier wafer on the BS-BEOL metallization structure in the process of forming the IC, because the single carrier wafer can be left in place after the BS-BEOL metallization structure is processed and when the FS-BEOL metallization structure is later formed and processed. Because the access to the IC is through metal lines in the FS-BEOL metallization structure, conductive bumps can be formed and coupled to the FS-BEOL metallization structure using the carrier wafer coupled to the BS-BEOL metallization structure.

The process 800 in FIGS. 8A and 8B and the exemplary fabrication stages of an IC fabricated in FIGS. 9A-9E are described below in reference to each other. The reference to elements below in the process 800 in FIGS. 8A and 8B and the fabrication stages in FIGS. 9A-9E of an IC fabricated according to the process 800 in FIGS. 8A and 8B use the same or similar element names as in the IC package 100 and its IC 102 in FIGS. 1-2B and 4A-4B. The discussion of examples of these elements in FIGS. 1-2B and 4A-4B is also applicable to the fabrication stages of the IC in FIGS. 9A-9E.

In this regard, the process 800 includes first forming a BS-BEOL metallization structure 908 on a back side 938B of a substrate 932 as shown in fabrication stage 900A in FIG. 9A (block 802 in FIG. 8A). The BS-BEOL metallization structure 908 is formed before a semiconductor layer and FS-BEOL metallization structure are formed in this process example. A next step in the process 800 is to form a carrier wafer 934 on a back side 940B of the BS-BEOL metallization structure 908, as shown in the fabrication stage 900B in FIG. 9B (block 804 in FIG. 8A). This is to provide mechanical stability for processing the layers that will form the IC. A next step in the process 800 is to grind down a front side 938F of the substrate 932, as shown in the fabrication stage 900B in FIG. 9B, to provide a grinded down substrate 932 as shown in the fabrication stage 900C in FIG. 9C (block 806 in FIG. 8A).

A next step in the process 800 is to dispose a semiconductor layer 914 on a front side 938F of the substrate 932 as shown in the fabrication stage 900D in FIG. 9D (block 808 in FIG. 8B). The semiconductor layer 914 includes a front side 920F and a back side 920B opposite the front side 920F. Semiconductor devices 912 are formed in the semiconductor layer 914. The process 800 also includes forming a FS-BEOL metallization structure 906 on the front side 920F of the semiconductor layer 914 before forming a BS-BEOL metallization structure 908 adjacent to the back side 920B of the semiconductor layer 914 to form an IC die 904, as shown in fabrication stage 900D in FIG. 9D (block 808 in FIG. 8B). The carrier wafer 934 that was previously formed remains to provide the mechanical structure to support the formation and processing of the FS-BEOL metallization structure 906. The FS-BEOL metallization structure 906 will facilitate I/O signal routing, and to route power signals to the BS-BEOL metallization structure 908 to route power signals. The process 800 then includes forming a plurality of conductive bumps 910 on the front side 936F of the FS-BEOL metallization structure 906, wherein at least one conductive bump 910 is coupled to a front side interconnect 902 of the FS-BEOL metallization structure 906 of the IC die 904, as shown in fabrication stage 900E in FIG. 9E (block 810 in FIG. 8B).

It is noted that the term "couple" and its derivatives such as "couples" and "coupled" do not necessarily require a direct connection. For example, a coupling can include an electrical coupling. It is also noted that the terms "front," "front side," "back," and "back side" where used herein are relative terms. For example, these terms are not meant to limit or imply a strict orientation that "front" or "front side" is above "back" or "back side" relative to ground, but only a relative orientation to another stated orientation. For example, a "front side" of an element is a side that is on a generally opposite side of a "back side" of the element.

ICs that each include a FS-BEOL metallization structure providing front-side input/output (I/O) signal routing to a semiconductor device(s), and BS-BEOL metallization structure providing back side power routing to the semiconductor device(s), including but not limited to the ICs in FIGS. 1-2B, 4A-4B, 7A-7G, and 9A-9E, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
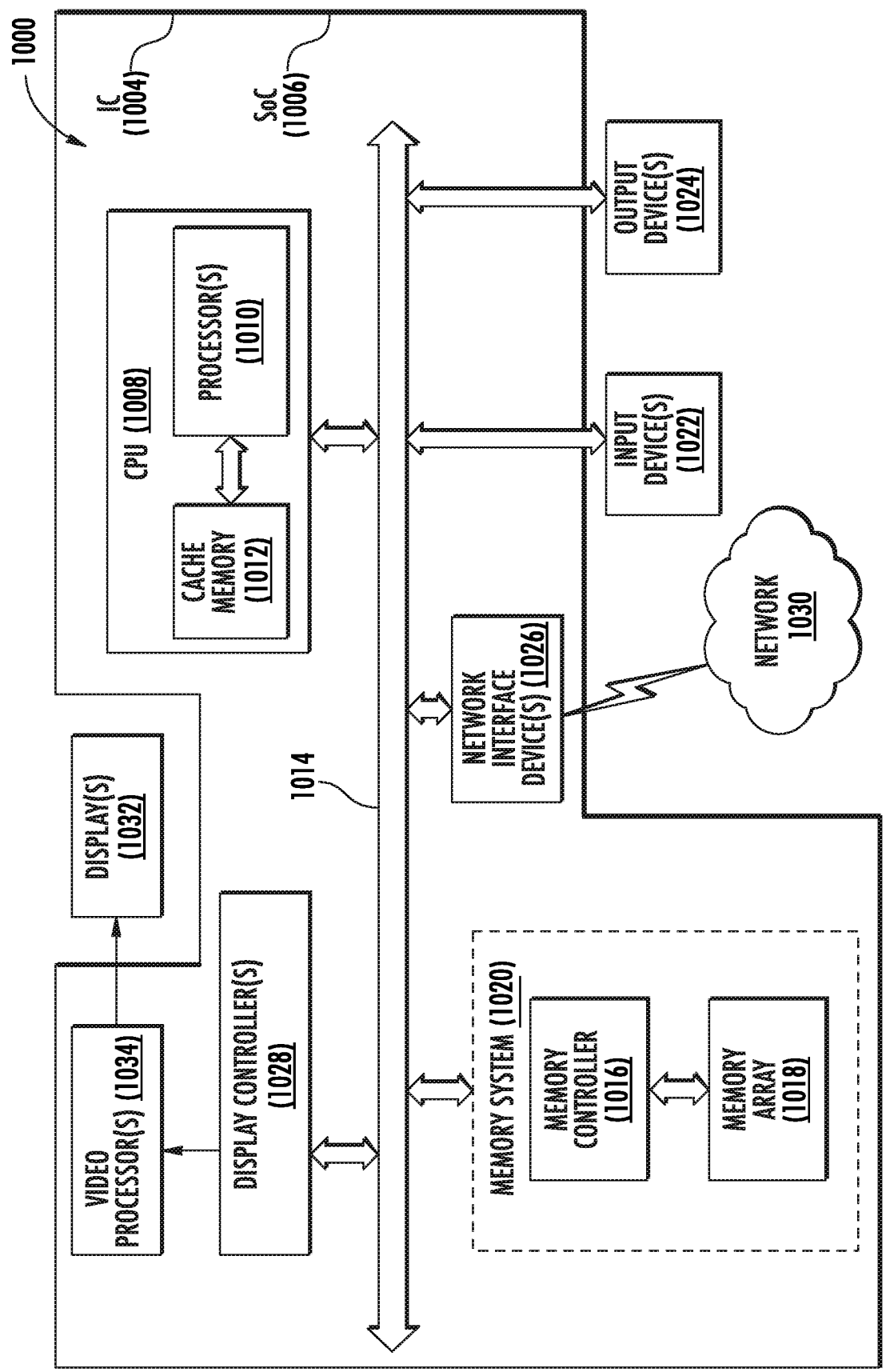
FIG. 10 is a block diagram of an exemplary processor-based system that can include one or more ICs that each include a FS-BEOL metallization structure providing front side I/O signal routing to a semiconductor device(s), and a BS-BEOL metallization structure providing back side power routing to the semiconductor device(s), including but not limited to the ICs in FIGS. 1-2B, 4A-4B, 7A-7G, and 9A-9E.

In this regard, FIG. 10 illustrates an example of a processor-based system 1000 that includes ICs that include a FS-BEOL metallization structure providing front-side input/output (I/O) signal routing to a semiconductor device(s), and BS-BEOL metallization structure providing back side power routing to the semiconductor device(s), including but not limited to the ICs in FIGS. 1-2B, 4A-4B, 7A-7G, and 9A-9E, and according to any aspects disclosed herein. For example, the ICs may be FETs that are employed in CMOS circuits. In this example, the processor-based system 1000 may be formed as an IC 1004 as a system-on-a-chip (SoC) 1006. The processor-based system 1000 includes a CPU 1008 that includes one or more processors 1010, which may also be referred to as CPU cores or processor cores. The CPU 1008 may have a cache memory 1012 coupled to the CPU 1008 for rapid access to temporarily stored data. The CPU 1008 is coupled to a system bus 1014 and can intercouple master and slave devices included in the processor-based system 1000. As is well known, the CPU 1008 communicates with these other devices by exchanging address, control, and data information over the system bus 1014. For example, the CPU 1008 can communicate bus transaction requests to a memory controller 1016 as an example of a slave device. Although not illustrated in FIG. 10, multiple system buses 1014 could be provided, wherein each system bus 1014 constitutes a different fabric.

Other master and slave devices can be connected to the system bus 1014. As illustrated in FIG. 10, these devices can include a memory system 1020 that includes the memory controller 1016 and a memory array(s) 1018, one or more input devices 1022, one or more output devices 1024, one or more network interface devices 1026, and one or more display controllers 1028, as examples. Each of the memory system 1020, the one or more input devices 1022, the one or more output devices 1024, the one or more network interface devices 1026, and the one or more display controllers 1028 can include the ICs. The input device(s) 1022 can include any type of input device, including but not limited to input keys, switches, voice processors, etc. The output device(s) 1024 can include any type of output device, including, but not limited to, audio, video, other visual indicators, etc. The network interface device(s) 1026 can be any device configured to allow exchange of data to and from a network 1030. The network 1030 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1026 can be configured to support any type of communications protocol desired.

The CPU 1008 may also be configured to access the display controller(s) 1028 over the system bus 1014 to control information sent to one or more displays 1032. The display controller(s) 1028 sends information to the display(s) 1032 to be displayed via one or more video processors 1034, which process the information to be displayed into a format suitable for the display(s) 1032. The display(s) 1032 can include any type of display, including, but not limited to, a cathode ray tube (CRT), a liquid crystal display (LCD), a plasma display, a light emitting diode (LED) display, etc.

Figure 11:
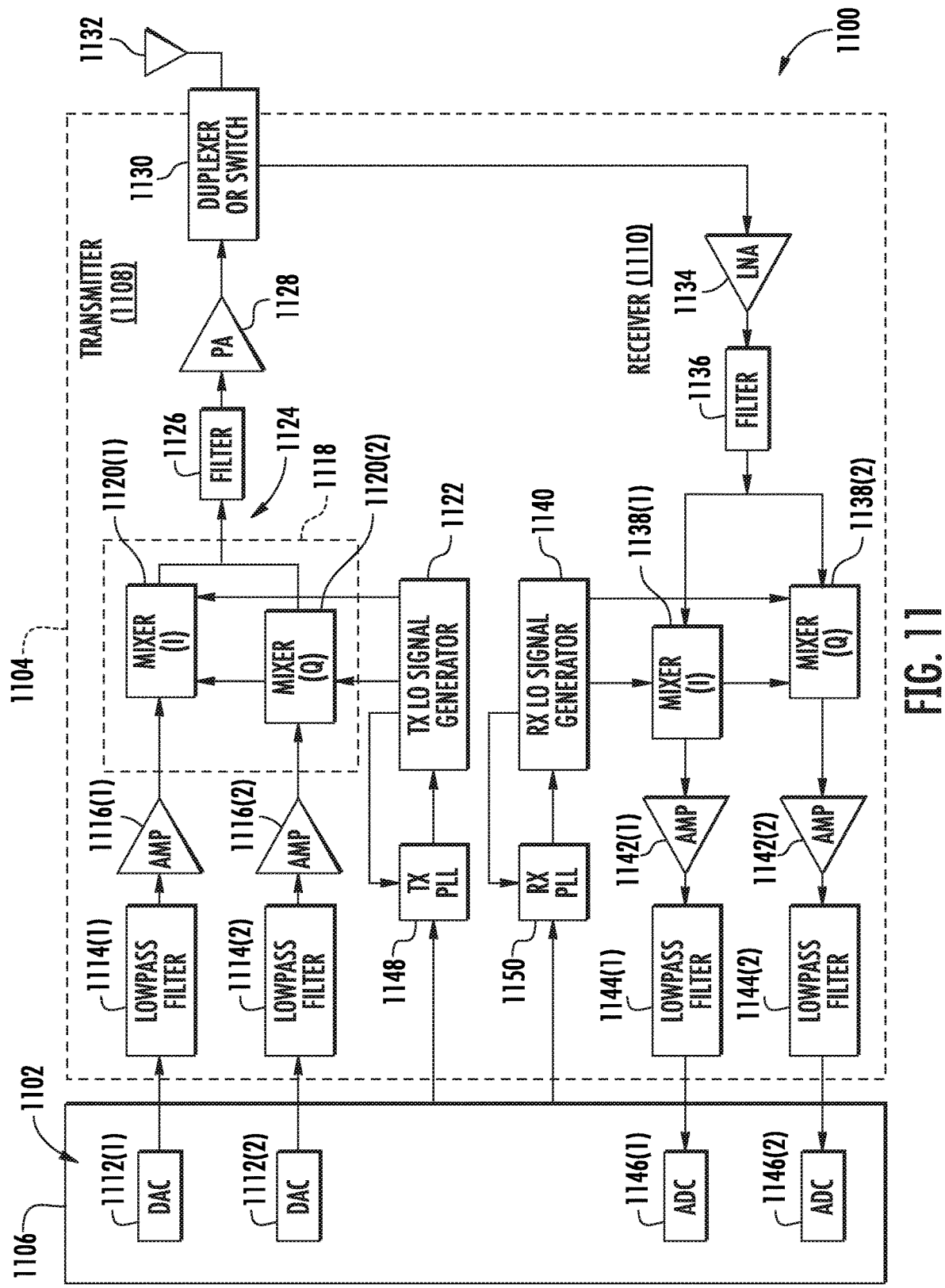
FIG. 11 is a block diagram of an exemplary wireless communications device that includes radio frequency (RF) components formed from one or more ICs that each include a FS-BEOL metallization structure providing front side I/O signal routing to a semiconductor device(s), and a BS-BEOL metallization structure providing back side power routing to the semiconductor device(s), including but not limited to the ICs in FIGS. 1-2B, 4A-4B, 7A-7G, and 9A-9E.

FIG. 11 illustrates an exemplary wireless communications device 1100 that includes radio frequency (RF) components formed from one or more ICs, wherein the ICs include a FS-BEOL metallization structure providing front-side input/output (I/O) signal routing to a semiconductor device(s), and BS-BEOL metallization structure providing back side power routing to the semiconductor device(s), including but not limited to the ICs in FIGS. 1-2B, 4A-4B, 7A-7G, and 9A-9E, and according to any aspects disclosed herein. The wireless communications device 1100 may include or be provided in any of the above referenced devices, as examples. As shown in FIG. 11, the wireless communications device 1100 includes a transceiver 1104 and a data processor 1106. The data processor 1106 may include a memory to store data and program codes. The transceiver 1104 includes a transmitter 1108 and a receiver 1110 that support bi-directional communications. In general, the wireless communications device 1100 may include any number of transmitters 1108 and/or receivers 1110 for any number of communication systems and frequency bands. All or a portion of the transceiver 1104 may be implemented on one or more analog ICs, RF ICs (RFICs), mixed-signal ICs, etc.

The transmitter 1108 or the receiver 1110 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1110. In the direct-conversion architecture, a signal is frequency-converted between RF and baseband in one stage. The super-heterodyne and direct-conversion architectures may use different circuit blocks and/or have different requirements. In the wireless communications device 1100 in FIG. 11, the transmitter 1108 and the receiver 1110 are implemented with the direct-conversion architecture.

In the transmit path, the data processor 1106 processes data to be transmitted and provides I and Q analog output signals to the transmitter 1108. In the exemplary wireless communications device 1100, the data processor 1106 includes digital-to-analog converters (DACs) 1112(1), 1112(2) for converting digital signals generated by the data processor 1106 into I and Q analog output signals, e.g., I and Q output currents, for further processing.

Within the transmitter 1108, lowpass filters 1114(1), 1114(2) filter the I and Q analog output signals, respectively, to remove undesired signals caused by the prior digital-to-analog conversion. Amplifiers (AMP) 1116(1), 1116(2) amplify the signals from the lowpass filters 1114(1), 1114(2), respectively, and provide I and Q baseband signals. An upconverter 1118 upconverts the I and Q baseband signals with I and Q transmit (TX) local oscillator (LO) signals through mixers 1120(1), 1120(2) from a TX LO signal generator 1122 to provide an upconverted signal 1124. A filter 1126 filters the upconverted signal 1124 to remove undesired signals caused by the frequency upconversion as well as noise in a receive frequency band. A power amplifier (PA) 1128 amplifies the upconverted signal 1124 from the filter 1126 to obtain the desired output power level and provides a transmit RF signal. The transmit RF signal is routed through a duplexer or switch 1130 and transmitted via an antenna 1132.

In the receive path, the antenna 1132 receives signals transmitted by base stations and provides a received RF signal, which is routed through the duplexer or switch 1130 and provided to a low noise amplifier (LNA) 1134. The duplexer or switch 1130 is designed to operate with a specific receive (RX)-to-TX duplexer frequency separation, such that RX signals are isolated from TX signals. The received RF signal is amplified by the LNA 1134 and filtered by a filter 1136 to obtain a desired RF input signal. Down-conversion mixers 1138(1), 1138(2) mix the output of the filter 1136 with I and Q RX LO signals (i.e., LO_I and LO_Q) from an RX LO signal generator 1140 to generate I and Q baseband signals. The I and Q baseband signals are amplified by amplifiers (AMP) 1142(1), 1142(2) and further filtered by lowpass filters 1144(1), 1144(2) to obtain I and Q analog input signals, which are provided to the data processor 1106. In this example, the data processor 1106 includes ADCs 1146(1), 1146(2) for converting the analog input signals into digital signals to be further processed by the data processor 1106.

In the wireless communications device 1100 of FIG. 11, the TX LO signal generator 1122 generates the I and Q TX LO signals used for frequency upconversion, while the RX LO signal generator 1140 generates the I and Q RX LO signals used for frequency downconversion. Each LO signal is a periodic signal with a particular fundamental frequency. A TX phase-locked loop (PLL) circuit 1148 receives timing information from the data processor 1106 and generates a control signal used to adjust the frequency and/or phase of the TX LO signals from the TX LO signal generator 1122. Similarly, an RX PLL circuit 1150 receives timing information from the data processor 1106 and generates a control signal used to adjust the frequency and/or phase of the RX LO signals from the RX LO signal generator 1140.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. An integrated circuit (IC), comprising:
a semiconductor layer comprising a front side and a back side opposite the front side, the semiconductor layer comprising a semiconductor device;
a front side (FS) back-end-of-line (BEOL) (FS-BEOL) metallization structure disposed adjacent to the front side of the semiconductor layer, the FS-BEOL metallization structure comprising:
a front side metal line; and
a front side interconnect coupled to the front side metal line;
a back side (BS) BEOL (BS-BEOL) metallization structure disposed adjacent to the back side of the semiconductor layer, the BS-BEOL metallization structure comprising:
a back side metal line;
a front side—back side connection structure coupled to the front side metal line and the back side metal line; and
the back side metal line coupled to the semiconductor device.

2. The IC of claim 1, wherein:
the front side interconnect is configured to receive a power signal; and
the back side metal line is configured to carry the power signal to the semiconductor device.

3. The IC of claim 1, wherein:
the front side interconnect is configured to receive a ground signal; and
the back side metal line is configured to carry the ground signal to the semiconductor device.

4. The IC of claim 1, wherein the FS-BEOL metallization structure further comprises:
a second front side metal line; and
a second front side interconnect coupled to the second front side metal line;
the second front side metal line coupled to the semiconductor device.

5. The IC of claim 4, wherein:
the second front side interconnect is configured to receive an input/output (I/O) signal; and
the second front side metal line is configured to carry the I/O signal to the semiconductor device.

6. The IC of claim 4, further comprising:
a front side metal contact coupled to the semiconductor device and the second front side metal line; and
a back side metal contact coupled to the semiconductor device and the back side metal line.

7. The IC of claim 6, further comprising:
a front side vertical interconnect access (via) coupled to the front side metal contact and the second front side metal line; and
a back side via coupled to the back side metal contact and the back side metal line.

8. The IC of claim 1, wherein the front side—back side connection structure comprises a head switch.

9. The IC of claim 8, wherein the head switch comprises a field-effect transistor (FET).

10. The IC of claim 9, wherein the FET comprises a drain and a source, one of the drain and the source coupled to the front side metal line, and one of the source and the drain not coupled to the front side metal line coupled to the back side metal line.

11. The IC of claim 1, further comprising a vertical interconnect access (via) coupled to the front side—back side connection structure and the back side metal line.

12. The IC of claim 11, wherein the via comprises a through-silicon via (TSV) disposed through the semiconductor layer and coupled to the front side—back side connection structure and the back side metal line.

13. The IC of claim 1, wherein the BS-BEOL metallization structure further comprises a back side metal layer comprising the back side metal line.

14. The IC of claim 13, wherein the BS-BEOL metallization structure further comprises a second back side metal layer disposed adjacent to the back side metal layer, the second back side metal layer comprising a second back side metal line coupled to the back side metal line.

15. The IC of claim 14, further comprising a back side vertical interconnect access (via) coupling the second back side metal line to the back side metal line.

16. The IC of claim 1, further comprising a conductive bump coupled to the front side interconnect.

17. The IC of claim 1, wherein:
the semiconductor layer further comprises a plurality of second semiconductor devices; and
the back side metal line is coupled to the plurality of second semiconductor devices.

18. The IC of claim 1, wherein:
the semiconductor layer further comprises a plurality of second semiconductor devices;
the FS-BEOL metallization structure further comprises:
a plurality of second front side metal lines;
a plurality of second front side interconnects each coupled to a respective second front side metal line among the plurality of second front side metal lines; and
the BS-BEOL metallization structure further comprises:
a plurality of second back side metal lines; and
the front side—back side connection structure comprises a plurality of second front side—back side connection structures each coupled to a respective second front side metal line among the plurality of second front side metal lines and a respective second back side metal line among the plurality of second back side metal lines;
the plurality of second back side metal lines is coupled to a respective second semiconductor device among the plurality of second semiconductor devices.

19. A method of fabricating an integrated circuit (IC), comprising:
disposing a semiconductor layer on a substrate, the semiconductor layer comprising a front side and a back side opposite the front side;
forming a semiconductor device in the semiconductor layer;
forming a front side (FS) back-end-of-line (BEOL) (FS-BEOL) metallization structure adjacent to the front side of the semiconductor layer, the FS-BEOL metallization structure comprising:
a front side metal line; and
a front side interconnect coupled to the front side metal line;
forming a back side (BS) BEOL (BS-BEOL) metallization structure adjacent to the back side of the semiconductor layer, the BS-BEOL metallization structure comprising:
a back side metal line coupled to the semiconductor device; and
forming a front side—back side connection structure coupled to the front side metal line and the back side metal line.

20. The method of claim 19, further comprising forming the FS-BEOL metallization structure adjacent to the front side of the semiconductor layer before forming the BS-BEOL metallization structure adjacent to the back side of the semiconductor layer.

21. The method of claim 20, further comprising, before forming the BS-BEOL metallization structure adjacent to the back side of the semiconductor layer:
forming a carrier wafer on a front side of the FS-BEOL metallization structure; and
grinding down a back side of the substrate.

22. The method of claim 21, further comprising:
forming a second carrier wafer on a back side of the BS-BEOL metallization structure;
removing the carrier wafer on the front side of the FS-BEOL metallization structure; and
forming a plurality of conductive bumps on the front side of the FS-BEOL metallization structure, a conductive bump among the plurality of conductive bumps coupled to the front side interconnect.

23. The method of claim 19, further comprising forming the BS-BEOL metallization structure adjacent to the back side of the semiconductor layer before
forming the FS-BEOL metallization structure adjacent to the front side of the semiconductor layer.

24. The method of claim 23, further comprising:
forming a carrier wafer on a back side of the BS-BEOL metallization structure; and
grinding down a front side of the substrate.

25. The method of claim 24, further comprising:
forming a plurality of conductive bumps on a front side of the FS-BEOL metallization structure, a conductive bump among the plurality of conductive bumps coupled to the front side interconnect; and
removing the carrier wafer from the back side of the BS-BEOL metallization structure.

* * * * *